US012682938B2

(12) United States Patent
Yang et al.

(10) Patent No.: US 12,682,938 B2
(45) Date of Patent: Jul. 14, 2026

(54) HEUSLER ALLOY BASED SPIN-TRANSFER-TORQUE MAGNETIC TUNNEL JUNCTIONS FOR FLASH MEMORY AND THE LIKE

(71) Applicants: International Business Machines Corporation, Armonk, NY (US); Samsung Electronics Co., Ltd., Gyeonggi-Do (KR)

(72) Inventors: See-Hun Yang, Morgan Hill, CA (US); Chirag Garg, San Jose, CA (US); Panagiotis Charilaos Filippou, Fremont, CA (US); Jaewoo Jeong, Los Altos, CA (US); Jason Robert Joseph Martineau, Fremont, CA (US); Mahesh Samant, San Jose, CA (US)

(73) Assignees: INTERNATIONAL BUSINESS MACHINES CORPORATION, Armonk, NY (US); Samsung Electronics Co., Ltd., Gyeonggi-Do (KR)

( * ) Notice: Subject to any disclaimer, the term of this patent is extended or adjusted under 35 U.S.C. 154(b) by 78 days.

(21) Appl. No.: 18/541,092

(22) Filed: Dec. 15, 2023

(65) Prior Publication Data
US 2025/0201290 A1    Jun. 19, 2025

(51) Int. Cl.
| | |
|---|---|
| *G11C 11/16* | (2006.01) |
| *H10N 50/10* | (2023.01) |
| *H10N 50/85* | (2023.01) |

(52) U.S. Cl.
CPC ........ *G11C 11/161* (2013.01); *G11C 11/1657* (2013.01); *G11C 11/1675* (2013.01);
(Continued)

(58) Field of Classification Search
CPC ........ H10N 50/10; H10N 50/85; H10N 50/01; H10N 50/80; H10N 59/00; H10N 50/20;
(Continued)

(56) References Cited

U.S. PATENT DOCUMENTS

| | | | |
|---|---|---|---|
| 9,042,057 | B1 | 5/2015 | Diao |
| 10,283,701 | B1 | 5/2019 | Ikhtiar |

(Continued)

FOREIGN PATENT DOCUMENTS

WO    2025/124948 A1    6/2025

OTHER PUBLICATIONS

International Searching Authority, "Notification of Transmittal of the International Search Report and the Written Opinion of the International Searching Authority, or Declaration," Patent Cooperation Treaty Apr. 22, 2025, 22 pages, International Application No. PCT/ EP2024/084224.

(Continued)

*Primary Examiner* — Amir Zarabian
(74) *Attorney, Agent, or Firm* — Amin, Turocy & Watson, LLP

(57)    ABSTRACT

A memory array includes a word lines intersecting bit line-complementary bit line pairs at a plurality of cell locations. Magnetic tunnel junction cells are located at each location, and each cell is electrically connected to a corresponding bit line and selectively interconnected to a corresponding one of the complementary bit lines under control of a corresponding one of the word lines. Each cell includes a substrate; a seed layer overlying the substrate; a nitride layer, overlying the seed layer, and having a thickness greater than 5 Angstroms; a templating layer, outward of the nitride layer, including a binary alloy having an alternating layer lattice structure, and having a thickness greater than 50 Angstroms; a magnetic layer overlying the templating layer, (Continued)

including a Heusler compound and exhibiting PMA; a tunnel barrier outward of the magnetic layer; and a magnetic layer outward of the tunnel barrier.

24 Claims, 22 Drawing Sheets

(52) U.S. Cl.
CPC ......... *G11C 11/1697* (2013.01); *H10N 50/10* (2023.02); *H10N 50/85* (2023.02)

(58) Field of Classification Search
CPC .............. G11C 11/161; G11C 11/1657; G11C 11/1655; G11C 11/1659; G11C 11/1675; G11C 11/1697; H10B 61/22; H10B 61/00; H10B 61/20; H10B 61/10; H10B 80/00; H01F 10/1936; H01F 10/3254; H01F 10/3268; H01F 10/30; H01F 10/3272; H01L 23/5283; H01L 25/16
See application file for complete search history.

(56) References Cited

U.S. PATENT DOCUMENTS

| | | | |
|---|---|---|---|
| 11,004,465 | B2 | 5/2021 | Kasai |
| 11,177,432 | B2 | 11/2021 | Chen |
| 11,309,115 | B2 | 4/2022 | Nakada |
| 11,410,689 | B2 | 8/2022 | Inubushi |
| 11,502,188 | B2 | 11/2022 | Lin |
| 11,552,242 | B2 | 1/2023 | Pereira De Sousa |
| 2019/0305040 | A1 | 10/2019 | Jeong et al. |
| 2022/0262555 | A1 | 8/2022 | Jeong et al. |
| 2023/0317129 | A1* | 10/2023 | Faleev ................... H10N 50/01 365/158 |
| 2023/0320231 | A1 | 10/2023 | Faleev et al. |
| 2025/0204269 | A1 | 6/2025 | Yang et al. |

OTHER PUBLICATIONS

Mondal et al., "In Situ Stochastic Training of MTJ Crossbars With Machine Learning Algorithms", ACM Journal on Emerging Technologies in Computing Systems (JETC), vol. 15, Issue 2 Article No. 16, Mar. 28, 2019, pp. 1-29, https://doi.org/10.1145/3309880.

Vincent et al., "Spin-Transfer Torque Magnetic Memory as a Stochastic Memristive Synapse for Neuromorphic Systems", IEEE Transactions on Biomedical Circuits and Systems, vol. 9, Issue: 2, Apr. 14, 2015, 09 pages.

Zhou et al., "Experimental Demonstration of Neuromorphic Network with STT MTJ Synapses", arxiv.org, Cornell University Library, 201 Olin Library, Dec. 9, 2021, pp. 04.

Julie Grollier et al., "Neuromorphic spintronics," Nature electronics, vol. 3, No. 7, 2020, pp. 360-370.

Steven Lequeux et al., "A magnetic synapse: multilevel spin-torque memristor with perpendicular anisotropy," Scientific Reports, vol. 6, No. 1, 2016, pp. 1-7.

United States Patent And Trademark Office, Non Final Office Action, Aug. 29, 2025, 8 pages, U.S. Appl. No. 18/541,040.

United States Patent And Trademark Office, "Notice of Allowance", Jun. 2, 2026, 7 pages, U.S. Appl. No. 18/541,040.

* cited by examiner

301 —◑ Ge Atom (Main Group Atom)

303 —◯ Mn Atom (X Position or Tetrahedrally Coordinated by Z)

305 —● Mn Atom (Y Position or Octahedrally Coordinated by Z)

$$AP\ Area\ Fraction = 1 - \frac{(R_{max}/R_{min} - R/R_{min})}{(R/R_{min} * R_{max}/R_{min} - R/R_{min})}$$

700

HEUSLER ALLOY BASED SPIN-TRANSFER-TORQUE MAGNETIC TUNNEL JUNCTIONS FOR FLASH MEMORY AND THE LIKE

BACKGROUND

The present invention relates generally to the electrical, electronic and computer arts and, more particularly, to magnetic tunnel junctions suitable for use in flash memory and the like.

Current magnetic random access memory (MRAM) devices use a magnetic tunnel junction (MTJ) as a storage element. A simple MTJ is a tri-layer structure containing two magnetic layers separated by a tunnel barrier layer. The magnetic state of one of the layers is switched using Spin Transfer Torque (STT). Thus, current MRAMs are three-layer devices employing a magnetic tunnel junction (MTJ). They typically include a reference layer magnet, a tunnel barrier, and a storage or free magnetic layer. The magnetic layer can either be a ferromagnet or a ferrimagnet. Current is passed through the device and the resistance is measured. The resistance changes based on the magnetic orientation of the two magnetic layers, and the relative change in resistance is referred to as the tunnel magnetoresistance (TMR), which is related to the spin polarization (i.e., high spin polarization implies high TMR). High spin polarization, and thus high TMR, is desirable (higher TMR provides a higher ON/OFF ratio). Low switching current is also desirable.

In a parallel configuration (e.g., storing a zero), the magnetic layers have their magnetizations aligned with each other; the resistance is typically lower in this state relative to the anti-parallel configuration (e.g., storing a one). In the anti-parallel state, the magnetic layers do not have their magnetizations aligned with each other; the resistance is typically higher in this state relative to the parallel configuration. The magnetic state of the MTJ is changed by passing a current through it. The current delivers spin angular momentum, so that once a threshold current is exceeded, the direction of the memory layer moment is switched. Since these MRAM devices are switched using STT, they are referred to as STT-MRAM. The magnitude of the switching current that is required is less when the magnetization of the electrodes is oriented perpendicular to the layers. The magnetic layers have magnetization perpendicular to the film surface (i.e. have perpendicular magnetic anisotropy (PMA)) as smaller switching currents are needed than for in-plane magnetized MTJs. MTJs with magnetic layers having PMA need smaller switching current than for in-plane magnetized layers.

Current MRAM devices employ alloys of cobalt, iron, and boron for the magnetic layers and these layers are ferromagnetic (such current devices do not scale well to smaller sizes). Heusler compounds are magnetic intermetallics with a face-centered cubic (FCC) crystal structure and a composition of $X_2YZ$ (full-Heuslers or simply "Heuslers"), where X and Y are transition metals and Z is in the p-block (or main group) of the periodic table. Half Heuslers have the composition XYZ. Reference herein to Heusler or Heuslers without the term "half" is intended to reference full-Heuslers. Heusler compounds have four interpenetrating FCC sublattices. CoFeB devices typically rely on interfacial (surface) anisotropy for PMA, while Heusler compounds typically have volume anisotropy for PMA.

Flash memory is an electronic non-volatile computer memory storage medium that can be electrically erased and reprogrammed.

BRIEF SUMMARY

Principles of the invention provide techniques for Heusler alloy based spin-transfer-torque magnetic tunnel junctions for flash memory and the like. In one aspect, an exemplary memory array includes a plurality of bit lines and a plurality of complementary bit lines forming a plurality of bit line-complementary bit line pairs; a plurality of word lines intersecting the plurality of bit line pairs at a plurality of cell locations; and a plurality of magnetic tunnel junction cells located at each of the plurality of cell locations. Each of the magnetic tunnel junction cells is electrically connected to a corresponding bit line and selectively interconnected to a corresponding one of the complementary bit lines under control of a corresponding one of the word lines. Each of the plurality of magnetic tunnel junction cells includes: a substrate; a seed layer overlying the substrate; a nitride layer, overlying the seed layer (optionally having a thickness greater than 5 Angstroms); a templating layer, outward of the nitride layer, comprising a binary alloy having an alternating layer lattice structure, and having a thickness greater than 50 Angstroms; a magnetic layer overlying the templating layer, the magnetic layer comprising a Heusler compound and exhibiting perpendicular magnetic anisotropy (PMA); a tunnel barrier outward of the magnetic layer; and a magnetic layer outward of the tunnel barrier.

In another aspect, a method of operating such an array includes providing a memory array as described, applying signals to the word lines to cause a first subset of the cells to store first logical values, a second subset of the cells to store second logical values, and a third subset of the cells to store third logical values, the first, second, and third logical values being different; and reading the first, second, and third stored logical values via the bit lines and the complementary bit lines.

In a further aspect, a hardware description language (HDL) design structure is encoded on a machine-readable data storage medium. The HDL design structure includes elements that when processed in a computer-aided design system generate a machine-executable representation of a memory array, as described.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects, as will be discussed further below. Features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
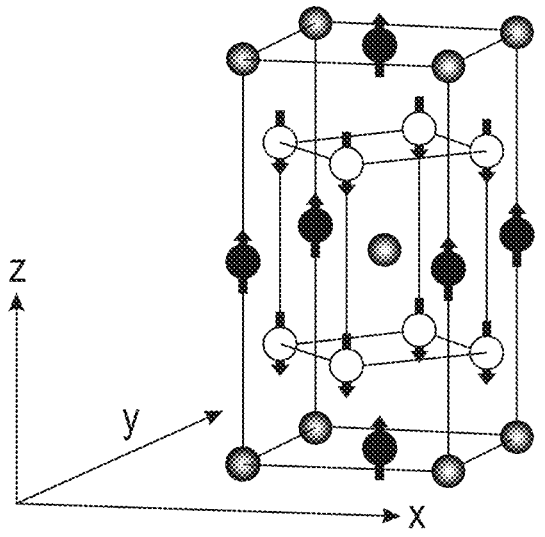
FIG. 1 shows a Heusler compound employed in aspects of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims.

That is, no limitations with respect to the embodiments shown and described herein are intended or should be inferred.

Given the discussion herein (reference characters refer to the drawings discussed below), it will be appreciated that, in general terms, an exemplary magnetic tunnel junction device (e.g., for multibit memory applications such as, for example, flash or the like) includes a substrate 1401; a seed layer 1403 overlying the substrate; a nitride layer 1403A, overlying the seed layer (optionally, having a thickness greater than 5 Angstroms); and a templating layer 1403B, outward of the nitride layer. The templating layer includes a binary alloy having an alternating layer lattice structure, and has a thickness greater than 50 Angstroms. Also included is a magnetic layer 1405 overlying the templating layer. The magnetic layer includes a Heusler compound and exhibiting perpendicular magnetic anisotropy (PMA). A tunnel barrier 1409 is outward of the magnetic layer, and a magnetic layer 1411 is outward of the tunnel barrier. This provides the benefit of a Heusler-based MTJ device with multi-state Heusler based free layer ideal for multibit flash applications.

In one or more embodiments, the device size (diameter) is greater than 50 nm. As noted above, any of the MTJ devices fabricated from any of the structures described herein can be, for example, >50 nm in diameter, or even >60 nm in diameter, or even >80 nm in diameter, or even >90 nm in diameter, or even >100 nm in diameter (these are all non-limiting examples; see FIG. 9A indicating that the percentage of devices with intermediate states increases as the nominal diameter increases). This provides the advantage of devices with reproducible switching between multiple states.

In a magnetic tunnel junction device, whether taken individually or as part of an array, in one or more embodiments, the Heusler layer is a free layer; and the magnetic layer is a pinned layer. The Heusler compound can, for example, be selected from the group consisting of $Mn_3Ge$, $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$. In one or more embodiments, the Heusler compound includes $Mn_3Ge$. In one or more embodiments, the Heusler layer has a thickness of less than 5 nm.

In one or more embodiments, in the magnetic tunnel junction device, whether taken individually or as part of an array, the tunnel barrier is selected from the group consisting of magnesium oxide and magnesium aluminum oxide. In one or more embodiments, the tunnel barrier is magnesium oxide. In some instances, the tunnel barrier includes $Mg_{1-z}Al_{2+(2/3)z}O_4$, wherein $-0.5 < z < 0.5$. In some instances, the binary alloy is represented by $Al_{1-x}E_x$, wherein A is a transition metal element and E is a main group element including at least one of aluminum and gallium, and x is in the range from 0.42 to 0.55. In some cases, the binary alloy includes CoAl. These features provide the benefit of a tunnel barrier that can be fabricated with the MgO material and devices where multiple step characteristics can be tuned by adjusting the size and shape of the device and by type and thickness of the seed layer.

In one or more embodiments, in the magnetic tunnel junction device, whether taken individually or as part of an array, the alternating layer lattice structure of the templating layer includes a cesium chloride structure. This provides the benefit of an effective seed layer.

Figure 17:
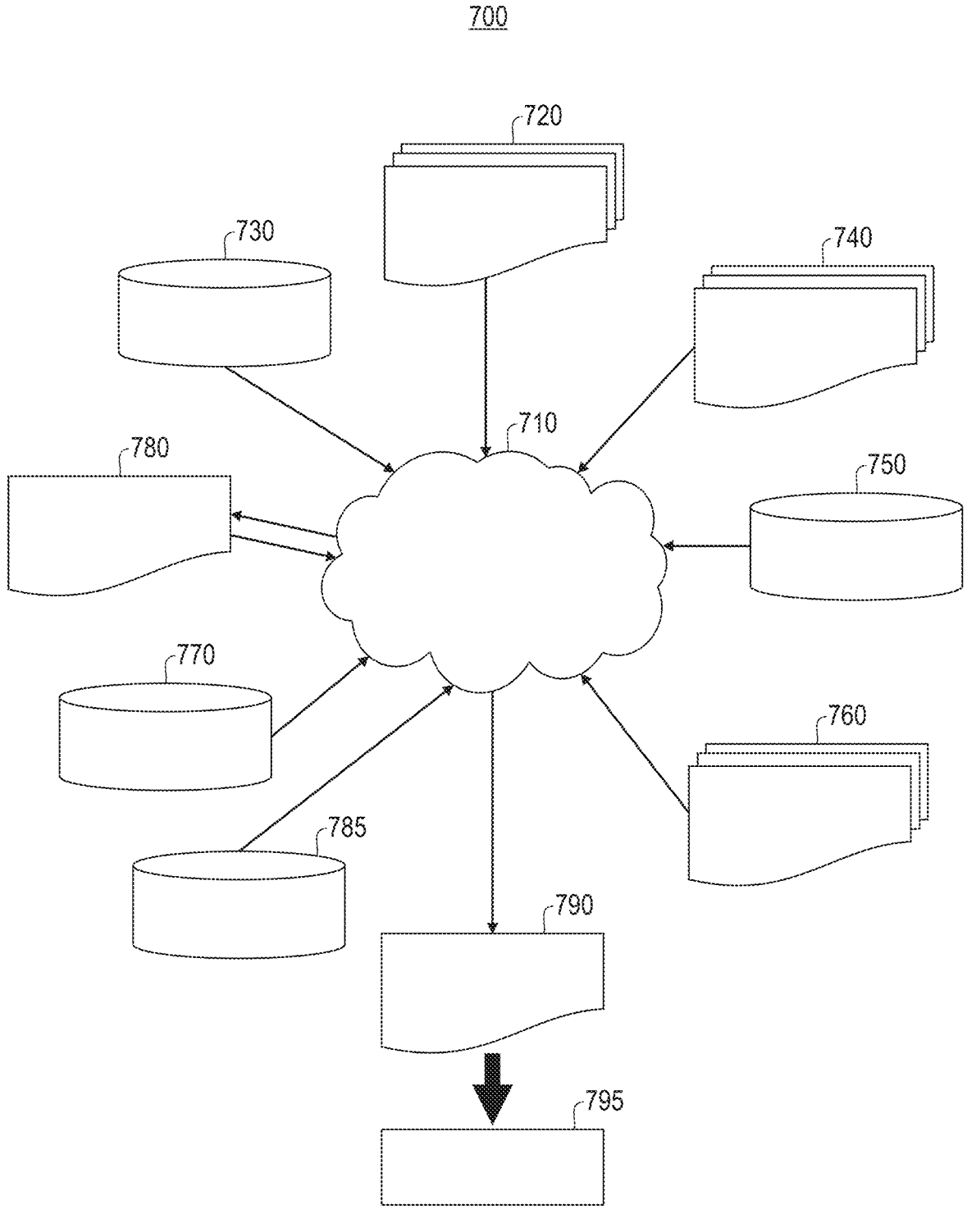
FIG. 17 is a flow diagram of a design process used in semiconductor design, manufacture, and/or test.

Referring to FIG. 17 and accompanying text, one or more embodiments include a hardware description language (HDL) design structure encoded on a machine-readable data storage medium. The HDL design structure incudes elements that when processed in a computer-aided design system generate a machine-executable representation of a multi-bit memory array (e.g., flash), as described. This provides the benefit of specifying fabrication parameters to a foundry for a device or array of devices with benefits as set forth above.

Figure 13:
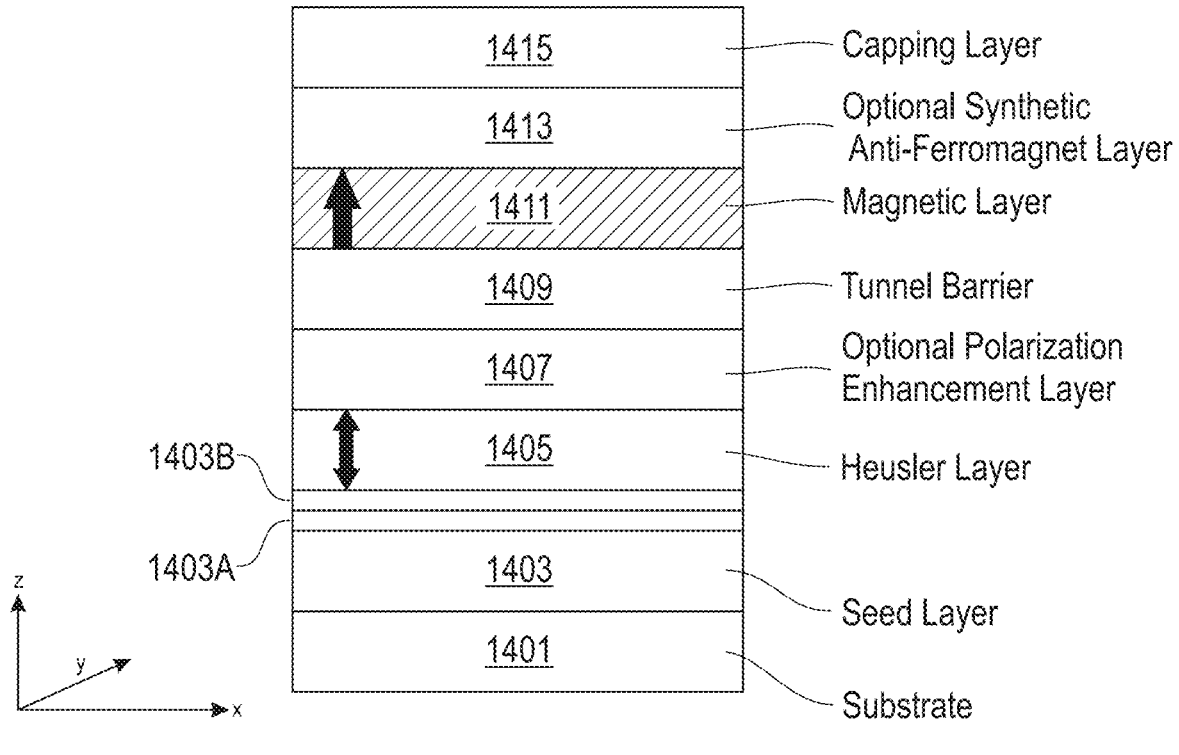
FIG. 13 shows an exemplary magnetic tunnel junction device for flash memory applications, according to an aspect of the invention.
Figure 14:
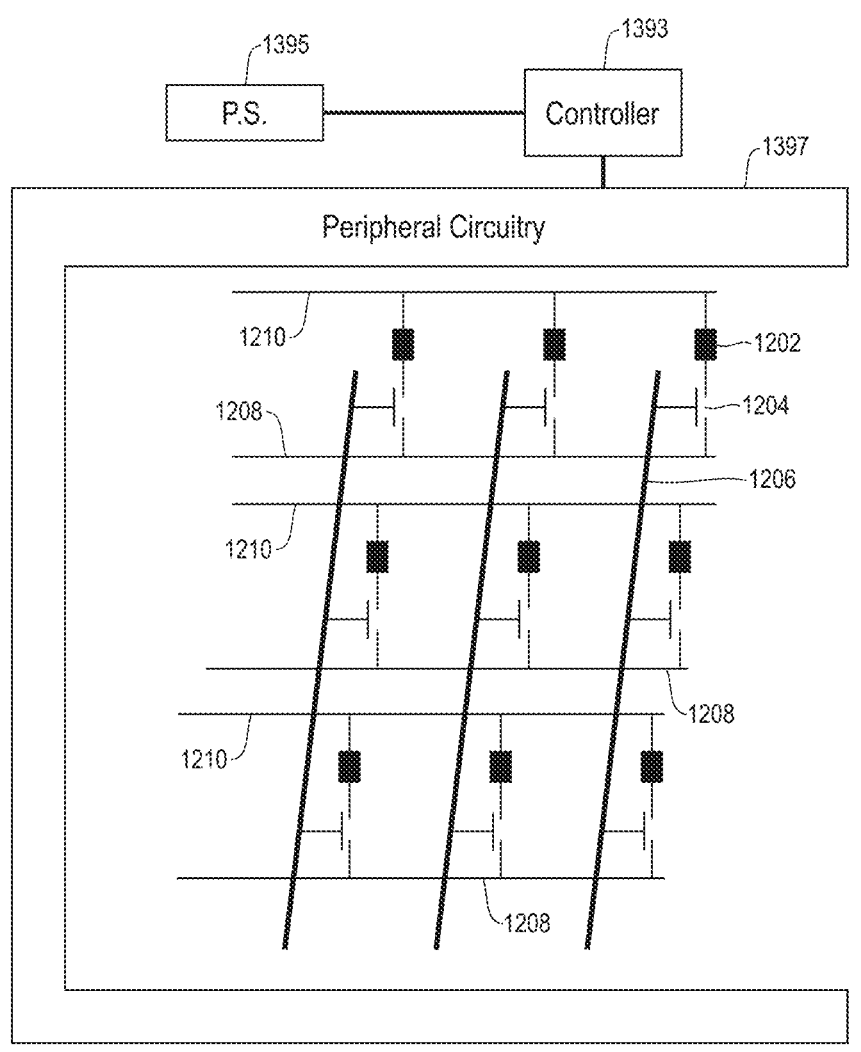
FIG. 14 shows an array of magnetic tunnel junction devices for a multibit flash memory, according to an aspect of the invention.
Figure 15:
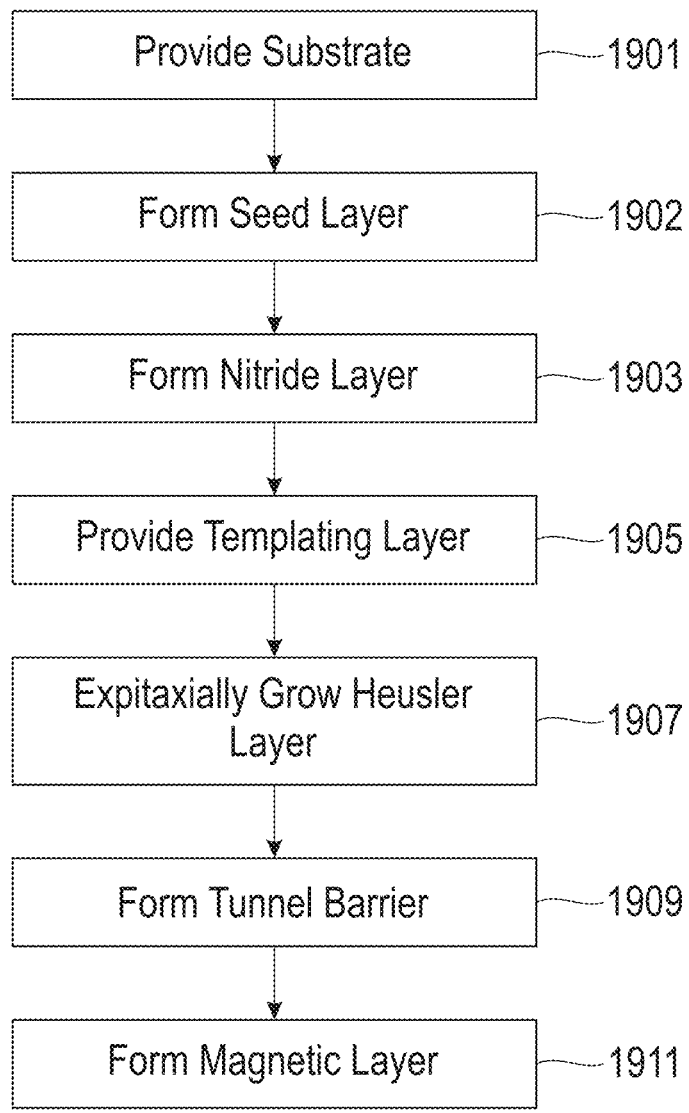
FIG. 15 shows a flow chart of a fabrication method, according to an aspect of the invention.

In yet another aspect, referring to FIG. 15, an exemplary method of forming a magnetic tunnel junction device, such as for flash memory applications (such as in FIG. 13 (device) and FIG. 14 (array)) includes, as per step 1901, providing a substrate 1401; as per step 1902, forming a seed layer 1403 overlying the substrate; and as per step 1903, forming a nitride layer 1403A, overlying the seed layer, and optionally having a nitride layer thickness greater than 5 Angstroms. A further step includes, as per step 1905, providing a templating layer 1403B, outward of the nitride layer, and including a binary alloy having an alternating layer lattice structure, and having a thickness greater than 50 Angstroms. Still further steps include, as per step 1907, epitaxially growing a magnetic layer 1405 on the templating layer, the magnetic layer including a Heusler compound and exhibiting perpendicular magnetic anisotropy (PMA); as per step 1909, forming a tunnel barrier 1409 outward of the magnetic layer; and, as per step 1911, forming a magnetic layer 1411 outward of the tunnel barrier. The method can also include providing and/or forming other elements seen in FIGS. 13 and/or 14 using techniques apparent to the skilled artisan, given the teachings herein. The cells can be integrated into an array by forming a plurality of cells at the same time and interconnecting them with wires, transistors (if used), and peripheral circuitry in a manner apparent to the skilled artisan, given the teachings herein. This provides the benefit of enabling fabrication of a Heusler-based MTJ device or array of devices with multi-state Heusler based free layer ideal for multibit flash applications It will be appreciated that the diffusion of the Heusler material's component atoms can be tuned or amplified by several methods: use of high temperature anneal; appropriate choice of seed layers, e.g. Ta/Ru/Ta instead of Ta; by external techniques such as ion bombardment, and the like. This provides the benefit of enabling fabrication of devices where multiple step characteristics can be tuned by adjusting the size and shape of the device and by type and thickness of the seed layer.

In one or more embodiments, the templating layer has a templating layer in-plane lattice constant, and the Heusler in-plane lattice constant substantially matches the templating layer in-plane lattice constant. As used herein, the Heusler in-plane lattice constant "substantially matches" the templating layer in-plane lattice constant when it matches the templating layer in-plane lattice constant or when the in-plane lattice constant of the tetragonal Heusler material has moved towards the in-plane lattice constant of the templating material from the in-plane lattice constant of the cubic Heusler material. In some cases, the Heusler in-plane lattice constant matches the templating layer in-plane lattice constant within +/−10%. In some cases, the Heusler in-plane lattice constant matches the templating layer in-plane lattice constant within +/−5%. The half metallic Heusler material has, for example, a magnetization substantially perpendicular to the half metallic Heusler layer. When magnetic layers have magnetization perpendicular to the film surface (i.e. have perpendicular magnetic anisotropy (PMA)), smaller switching currents are needed than for in-plane magnetized MTJs.

In another aspect, referring to FIG. 14, a memory array (flash is a non-limiting example) includes a plurality of bit lines 1210 and a plurality of complementary bit lines 1208 forming a plurality of bit line-complementary bit line pairs. A plurality of word lines 1206 intersect the plurality of bit line pairs at a plurality of cell locations. A plurality of magnetic tunnel junction cells 1202 are located at each of the plurality of cell locations. Each of the magnetic tunnel junction cells 1202 is electrically connected to a corresponding bit line 1210 and selectively interconnected to a corresponding one of the complementary bit lines 1208 under control of a corresponding one of the word lines 1206 (e.g., a respective transistor 1204 is a field effect transistor turned off or on by a signal from word line 1206 applied to its gate, which controls reading and writing and whether the cell is coupled to the complementary bit lines). This provides the benefit of an array of Heusler-based MTJ devices with multi-state Heusler based free layers ideal for multibit flash applications. Each magnetic tunnel junction cell 1202 can be generally structurally similar to the magnetic tunnel junction device described above with respect to FIG. 13.

Figure 16:
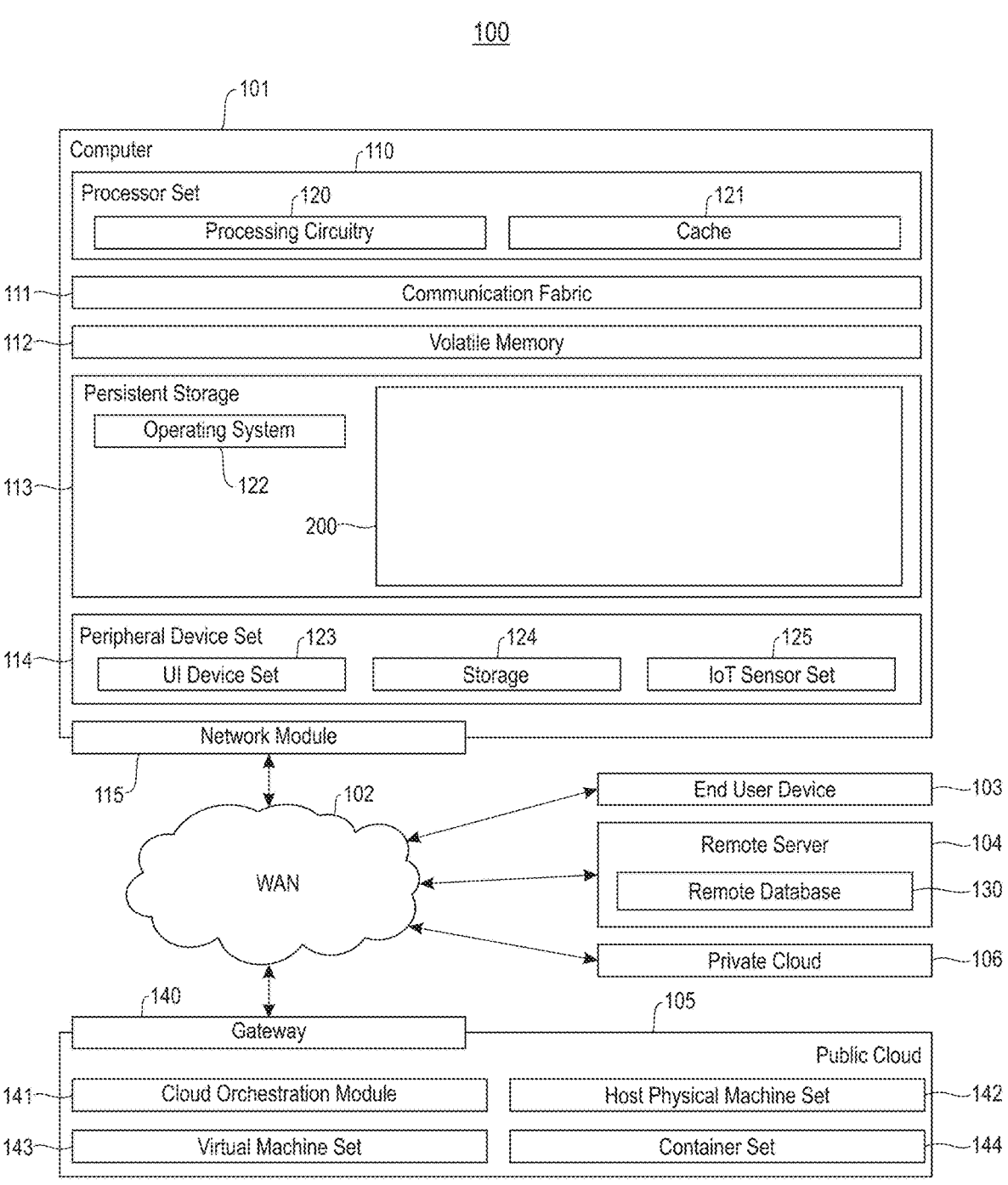
FIG. 16 depicts a computing environment according to an embodiment of the present invention (e.g., for implementing a design process such as that of FIG. 17)

One or more embodiments further include peripheral circuitry 1397 coupled to the plurality of bit line-complementary bit line pairs and the plurality of word lines; a power supply 1395; and a controller 1393 coupled to the power supply and the peripheral circuitry. The power supply can be controlled by the controller to supply appropriate voltages, and can be part of the controller or a separate unit. These elements are cooperatively configured for input/output and so on. Given the teachings herein, the skilled artisan will be able to provide any additional desired/required peripheral circuitry, voltage/power supply, elements to interface with peripheral circuitry, and the controller by adapting known techniques from flash memory and the like. To implement any of the digital circuitry described herein, computer-aided semiconductor integrated circuit (IC) logic design, simulation, test, layout, and/or manufacture can be employed. The computerized design process can represent functional and/or structural design features in a design structure generated using electronic computer-aided design (ECAD). A suitable hardware-description language (HDL) can be employed. The skilled artisan can synthesize digital logic circuits to carry out desired control and other functionality, using known computer-aided design techniques such as shown in FIG. 17 implemented on a machine such as depicted in FIG. 16. This provides the benefit of controlling the array for operation.

In one or more embodiments, the peripheral circuitry, the power supply, and the controller are cooperatively configured to apply signals to the word lines 1206 to cause a first subset of the cells 1202 to first logical values, a second subset of the cells 1202 to store second logical values, and a third subset of the cells 1202 to store third logical values. The first, second, and third logical values are all different. The peripheral circuitry, the power supply, and the controller are further cooperatively configured to read the first, second, and third stored logical values via the bit lines 1210 and the complementary bit lines 1208. This provides the benefit of enabling reading and writing. Typically, for flash applications, the capping layer 1415 of the device indicated in FIG. 13 connects to the bit line 1210 while the seed layer 1403 connects to bit line complement 1208 through the access FET.

In still another aspect, an exemplary method of operation includes providing an array such as just described, applying signals to cause the word lines 1206 to cause a first subset of the cells to store first logical values, a second subset of the cells to store second logical values, and a third subset of the cells to store third logical values (the first, second, and third logical values are different); and reading the first, second, and third stored logical values via the bit lines 1210 and the complementary bit lines 1208. This provides the benefit of enabling reading and writing.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

Heusler-based MTJ device with multi-state Heusler based free layer ideal for multibit flash applications;

devices with reproducible switching between multiple states;

devices that can achieve multiple states without need for specialized device fabrication processing;

devices with good endurance;

devices with improved stability;

devices that use only two terminals and can be readily scaled;

devices that have symmetric operation and threshold behavior;

devices that can exhibit the corresponding analogue functionalities compared to a racetrack device which uses motion of domain wall (DW) at significantly smaller size; and devices where multiple step characteristics can be tuned by adjusting the size and shape of the device and by type and thickness of the seed layer.

It is worth noting that current MRAM devices use magnetic tunnel junction (MTJ) as a storage element. A simple MTJ is a tri-layer structure containing two magnetic layers separated by tunnel barrier layer. Current MTJs using Cobalt Iron Boron (Co/Fe/B) are able to provide magnetic layers which have magnetization perpendicular to the film surface (i.e. exhibit perpendicular magnetic anisotropy (PMA), which is desirable). The perpendicular magnetic anisotropy (PMA) of Co—Fe—B layers arises from the interfaces between these layers and the tunnel barrier and/or the underlayer on which the Co—Fe—B layer is deposited.

It is also worth noting that, for MRAM, it is desirable that magnetic materials have volume PMA rather than surface (interfacial) PMA, as this enables scaling of devices to smaller sizes (typically smaller diameter). As device size is reduced, the devices become less thermally stable. However, for devices with volume anisotropy, it is advantageously possible to compensate for the lowering of thermal stability by increasing the magnetic layer thickness. The switching current is proportional to the product $(M_s V H_k)$ where $M_s$ is saturation magnetization, V is volume, and $H_k$ is the anisotropy field. Low moment (i.e., low $M_s$) Heusler compounds need lower switching currents than high moment materials (such as CoFe alloys) with the same thermal energy barrier, unless the increase in $H_k$ overwhelms the lower $M_s$.

Typically, Heusler compounds tend to be cubic. Thus, for a thin film of cubic Heusler the magnetic moment will be in the plane of the layer. For an MTJ for MRAM applications, it is highly desirable for the magnetic moments of the magnetic layer to be perpendicular to the layer.

We have found that Heusler compounds can be grown on an underlayer (e.g., CoAl) for use in MRAM applications.

One or more embodiments make use of a templating layer (in a non-limiting example, a chemical templating layer (CTL)). Referring to FIG. 1 consider now aspects of an exemplary chemical templating layer. A Heusler compound such as $Mn_3Ge$ (alternately $Mn_3Sn$ or $Mn_3Sb$) includes alternating layers of Mn—Mn and Mn—Ge atoms. In FIG. 1, atoms with shading 301 represent Ge atoms (main group atoms represented by Z), atoms with shading 303 represent Mn atoms of the X-position in $X_2YZ$ (tetrahedrally coordinated by Z), and atoms with shading 305 represent element Mn atoms of the Y-position in $X_2YZ$ (octahedrally coordinated by Z). Mn is a transition metal and Ge is from the main group of the periodic table. One of the alternating layers contains transition metal atoms 303 only and other contains main group element atoms 301 along with transition metal atoms 305. Thus, a seed layer containing a single element which lattice-matches the in-plane lattice constant does not promote growth of an ordered Heusler compound at low temperatures such as room temperature. An ideal seed layer includes a binary compound of a transition element and a main group element. Moreover, this ideal seed layer also has an alternating layer structure containing these two distinct elements. One layer has only the transition metal. The other layer has only the main group metal (the "Z" in $X_2YZ$ is a main group metal as well). These binary compounds have a CsCl-like (cesium chloride-like) structure (where each cesium ion is coordinated by eight chloride ions). Exemplary templating layers include CoAl, CoGa, and the like.

Referring to the crystal structure in FIG. 1, all 3 axes are not the same; dimensions a and b (not labelled in the figure, along the x and y axes) are the same in the depicted example, while dimension c (not labelled in the figure, along the vertical z axis) is different. Note the magnetization arrows going up and down along z. Stretching of crystals in the z direction yields volume anisotropy. Note the alternating layer structure. Use of a seed layer of CsCl-like structure allows room-temperature growth.

Figure 2:
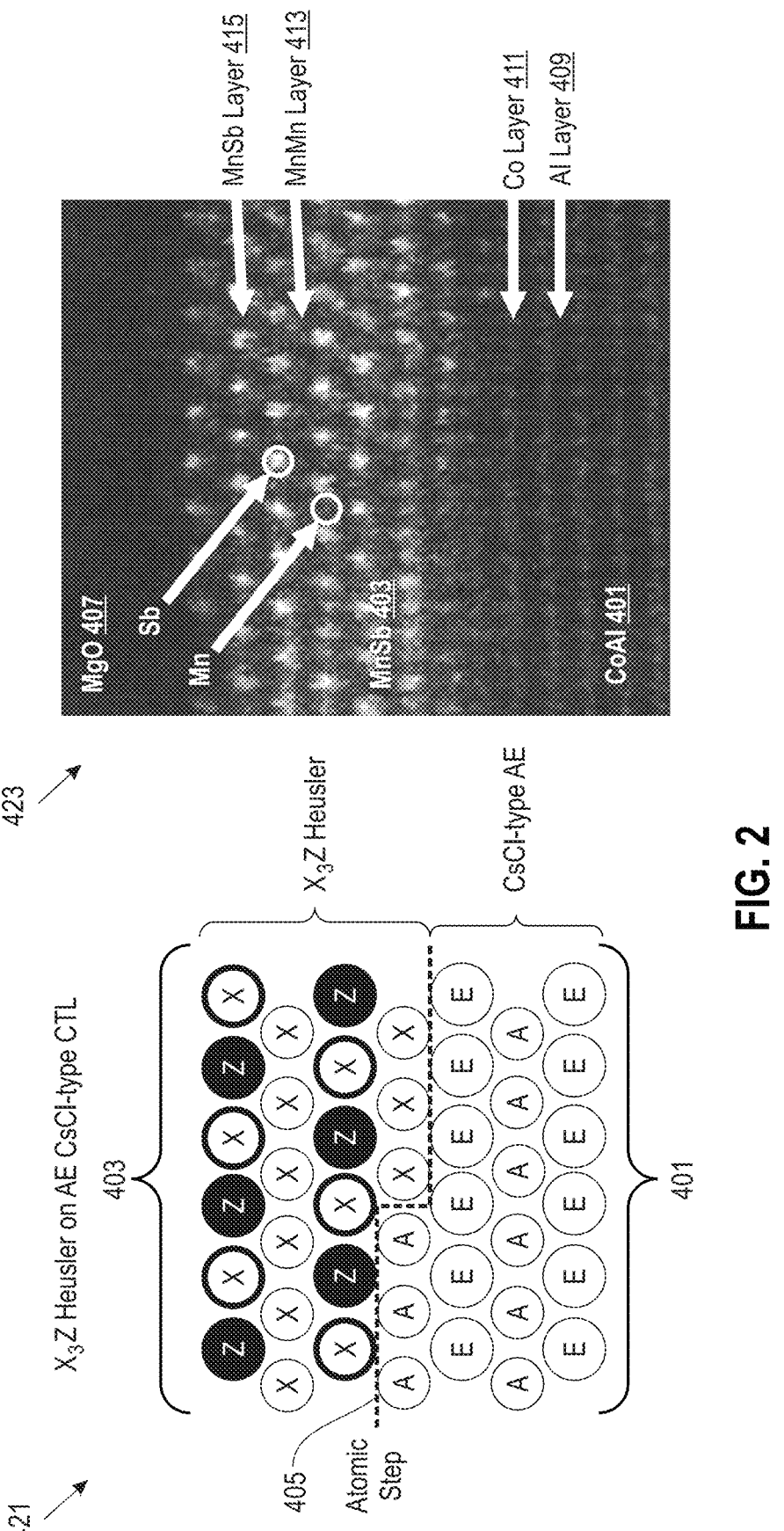
FIG. 2 shows growth of a Heusler compound on a templating layer according to aspects of the invention.

Referring now to FIG. 2, one or more embodiments employ a CsCl-type chemical templating layer (CTL) 401 (CoAl is an example of an excellent CsCl-type CTL) which promotes growth of an ordered Heusler compound even at ultrathin thicknesses and at room temperature. "E" can correspond, for example, to Al and "A" can correspond, for example, to Co. In FIG. 2, view 421 is a schematic while view 423 is a transmission electron microscopy (TEM) image. A Heusler compound such as $Mn_3Ge$ or $Mn_3Sn$ or $Mn_3Sb$ 403 grows epitaxially on top of the CoAl layer 401. We have found that even ternary Heusler compounds can be ordered by the CTL. Indeed, we have found that it is pertinent in one or more embodiments that the CoAl has (001) texture, implying the requirement for a seed layer underlying the CoAl which promotes such growth. Currently, a preferred seed layer includes $Sc_xN$ which promotes the (001) texture in CoAl on Si substrates. Furthermore, in one or more embodiments, Ta or Ta/Ru/Ta with ultrathin (5 Å) layer of amorphous CoFeB is located underneath the $Sc_xN$ layer. Note that illustrative Samples 1, 2, and 3 discussed below include $Mn_xN$ which can be replaced by more thermally stable $Sc_xN$.

The in-plane lattice constant of the Heusler compound is similar to that of the CoAl CTL. It is possible to strain the Heusler to a differing extent with an appropriate choice of CTL. We have found that even ternary Heusler compounds can be ordered by the CTL. As illustrated, the Mn (generally, X) grows on the Al and the Ge (generally, Z) grows on the Co. Note the atomic step 405. The Heusler material can be strained and thus adopts the in-plane lattice constant of the template material. One or more embodiments impose the lattice constant of the templating layer onto the Heusler layer. In view 423, note that CoAl 401 includes Al layers 409 and Co layers 411 and the MnSb 403 includes MnMn layer 413 and MnSb layer 415. Note the MgO tunnel barrier 407.

The three most prominent tetragonal Heusler compounds are $Mn_3Ge$, $Mn_3Sn$, and $Mn_3Sb$, and $Mn_3Sb$ has a larger difference in atomic number between Mn and Sb and thus is easier to see in the TEM image 423.

Figure 3B:
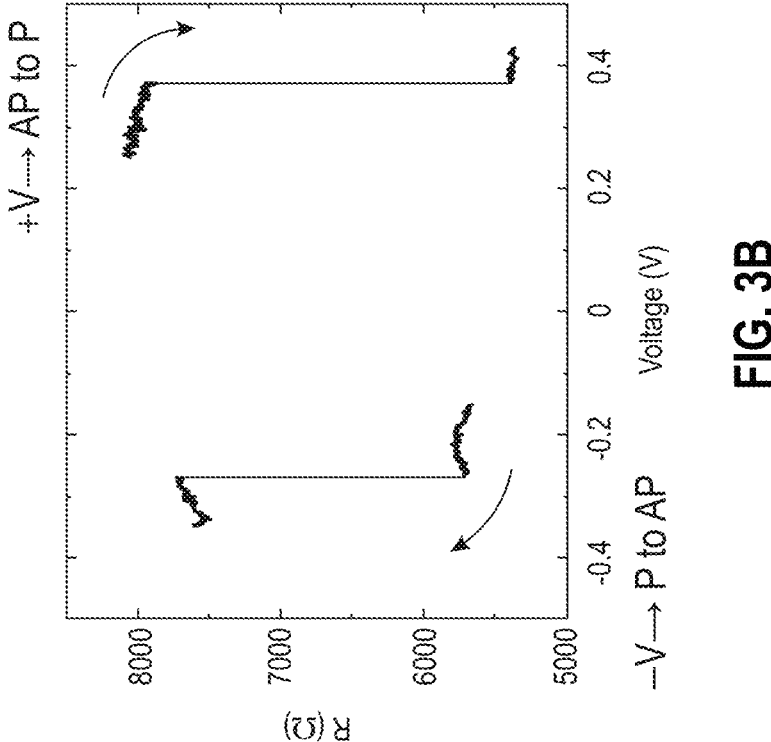
FIGS. 3B, 3C, and 3D show that a Heusler layer switches during an STT write operation according to aspects of the invention.
Figure 3A:
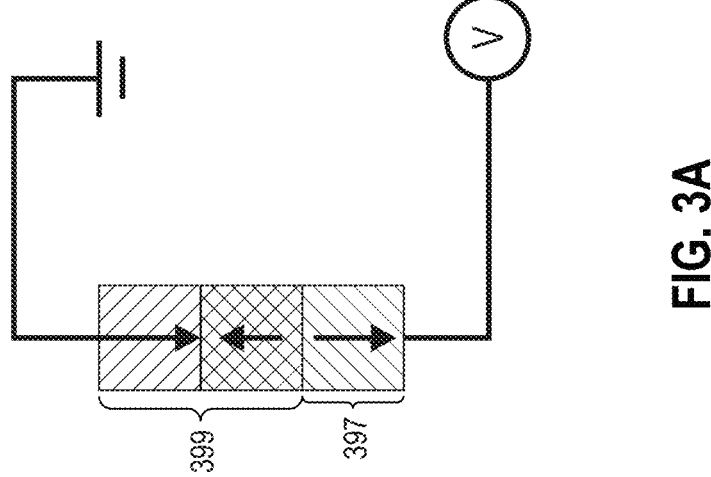
FIG. 3A shows a schematic of an MTJ device with electrical connections according to aspects of the invention.
Figures 3C, 3D:
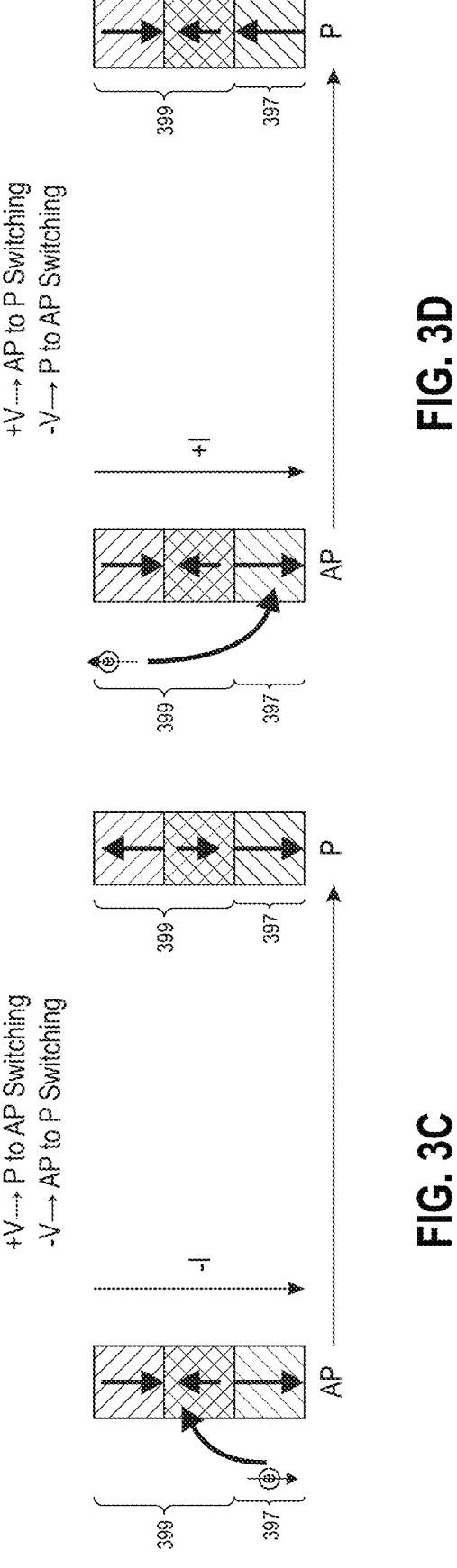

Referring to FIGS. 3A-3D, we have found, using electrical testing, that the Heusler layer switches during an STT write operation. In FIG. 3A note the voltage source V and ground and the device with the reference layer including Synthetic anti-ferromagnet (SAF) coupled to CoFeB portion 399 and storage layer including $Mn_3Ge$ portion 397. FIG. 3C shows a case where the CoFeB is switching with STT (symbolized by the encircled electron symbol and corresponding slender arrow indicates direction of electron flow). A positive voltage switches from parallel (P) to anti-parallel (AP) while a negative voltage switches from anti-parallel (AP) to parallel (P). Note that the $Mn_3Ge$ does not switch (no change to bold arrow for portion 397) while the CoFeB switching is symbolized by the reversal in direction of the corresponding bold arrows. FIG. 3D shows a case where the $Mn_3Ge$ is switching with STT (symbolized by the encircled electron symbol and corresponding slender arrow indicates direction of electron flow). A positive voltage switches from anti-parallel (AP) to parallel (P) while a negative voltage switches from parallel (P) to anti-parallel (AP). Note that the CoFeB does not switch (no change to bold arrows within portion 399) while the $Mn_3Ge$ switching is symbolized by the reversal in direction of the corresponding bold arrow.

FIG. 3B plots resistance (R) in ohms versus voltage in volts. The R-V loop shows that the switching sense agrees with FIG. 3D; i.e., the $Mn_3Ge$ Heusler layer is switching.

Figure 4:
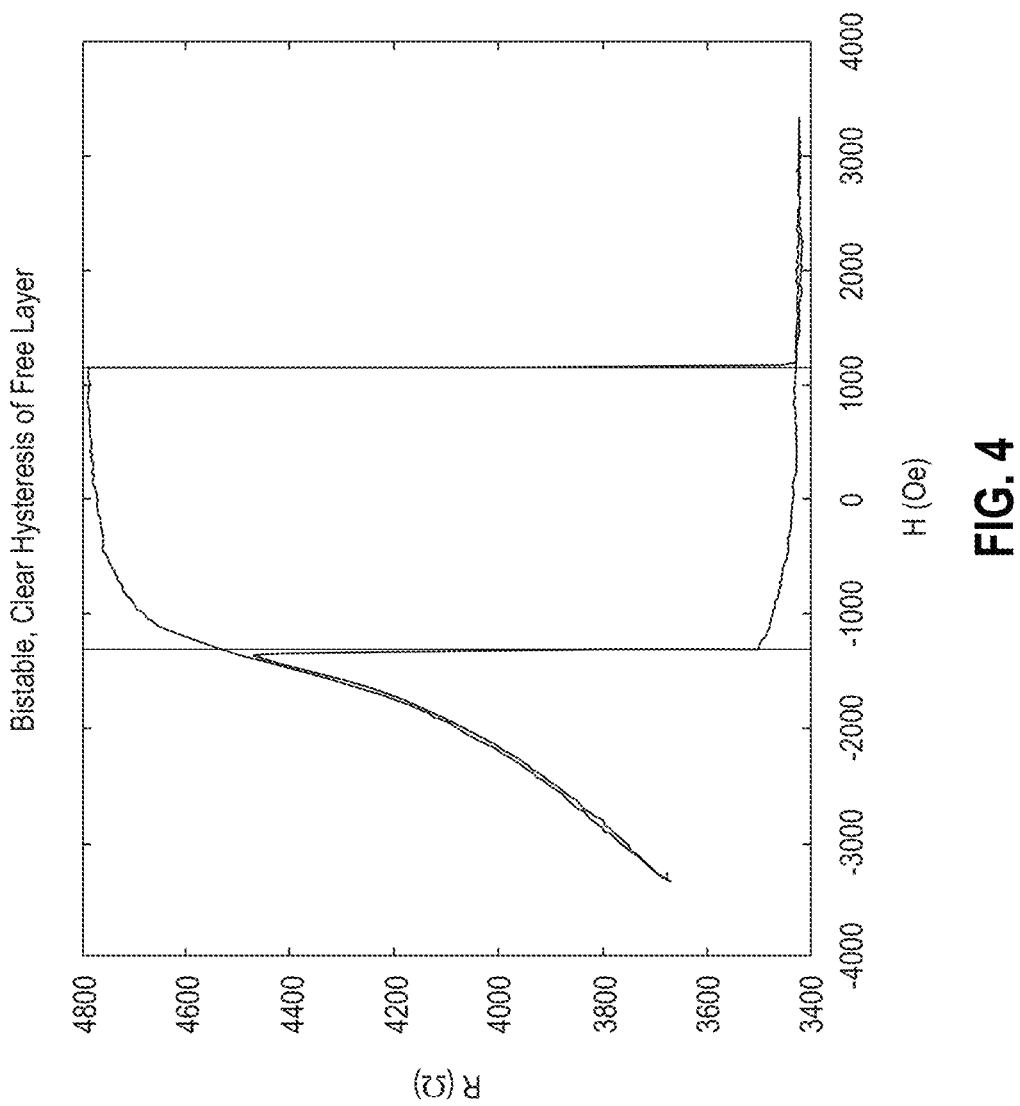
FIG. 4 shows a bistable, clear hysteresis of the Heusler free layer according to aspects of the invention.
Figures 5A, 5B:
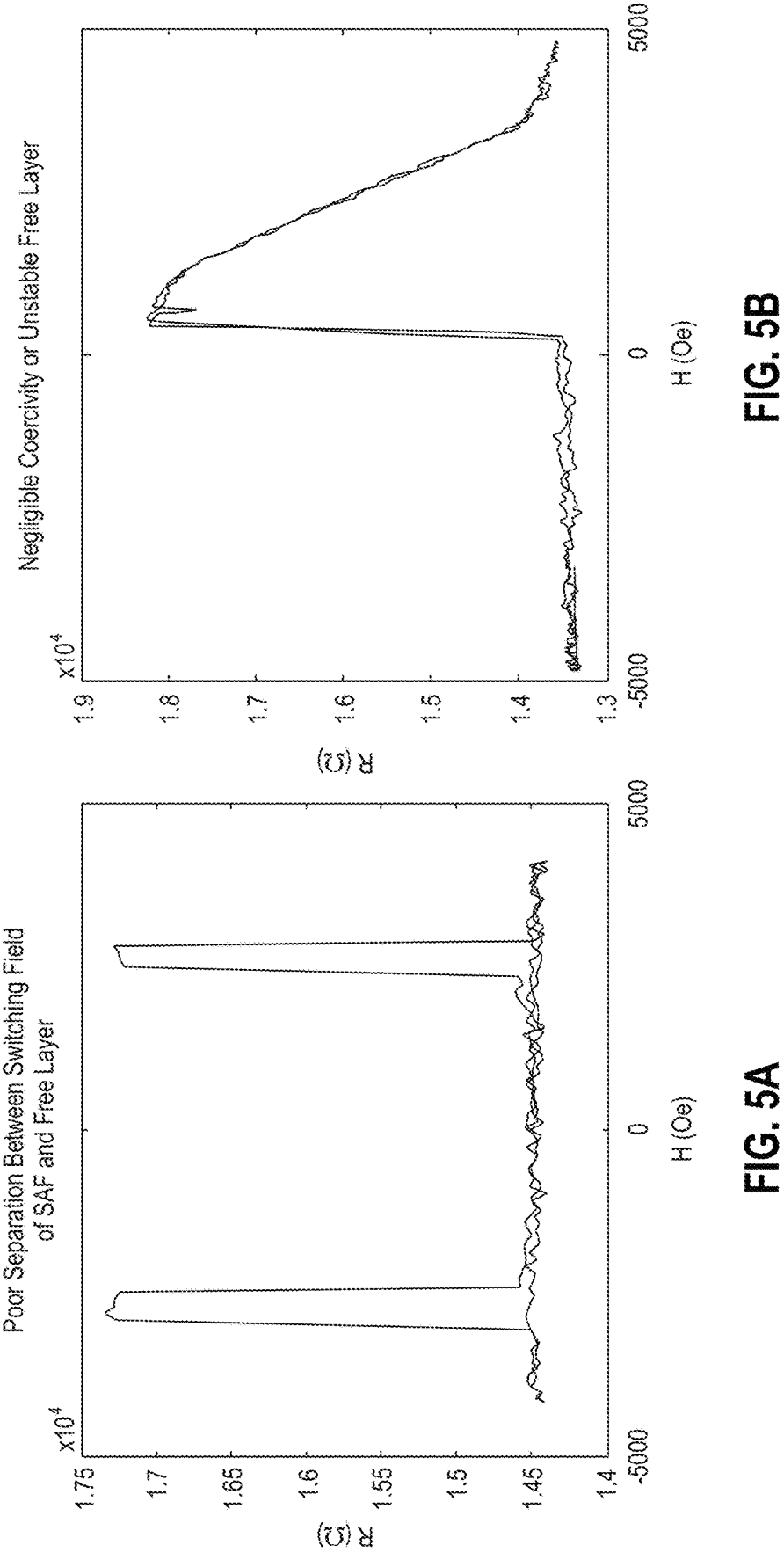
FIG. 5A shows a case with poor separation between the switching field of the Synthetic anti-ferromagnet (SAF) and the free layer.
FIG. 5B shows a case with negligible free layer coercivity or an unstable free layer.
Figures 5C, 5D:
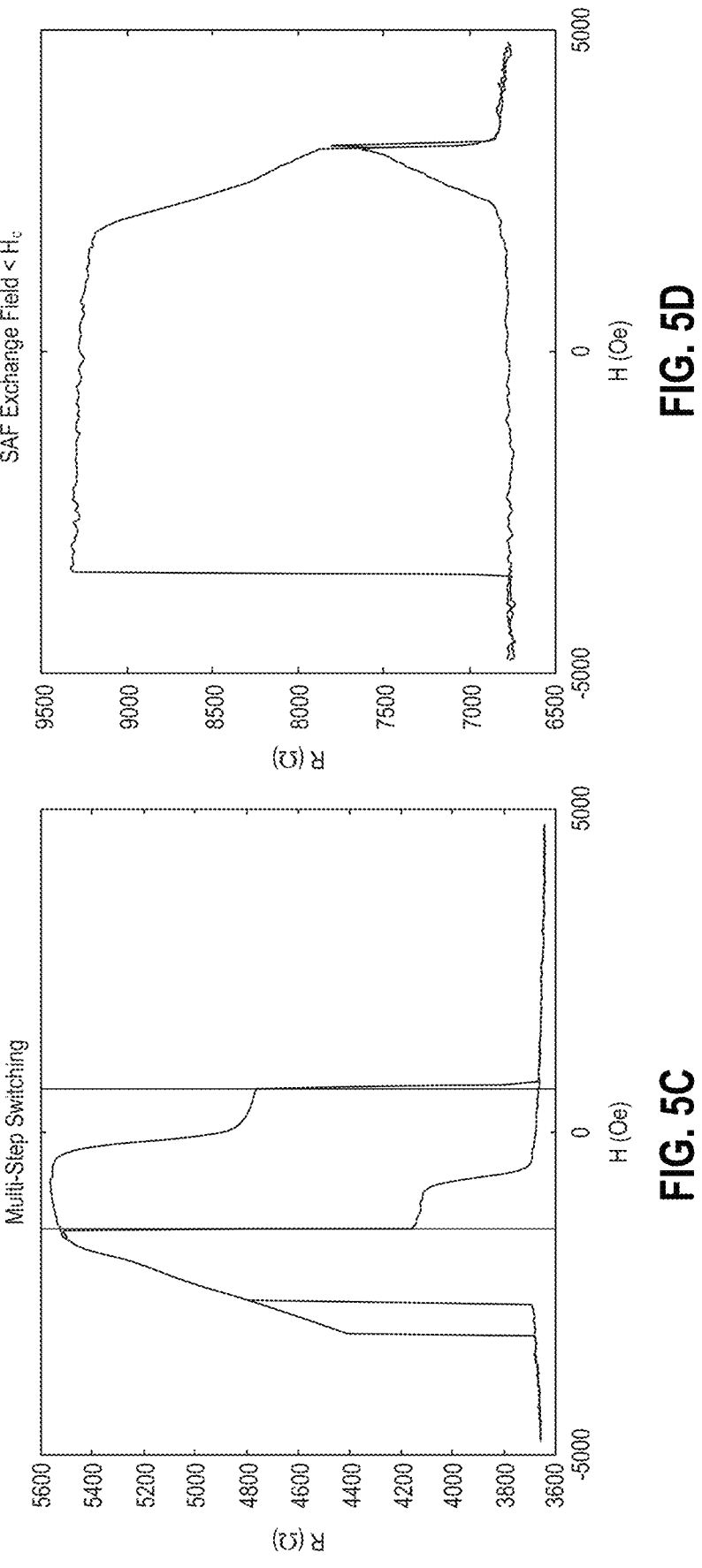
FIG. 5C shows a case with multi-step switching according to aspects of the invention.
FIG. 5D shows a case with the SAF exchange field less than free layer coercivity $H_c$.

We have found that intermediate states can be observed in Heusler free layer stacks on Si substrates. Referring to FIGS. 4 and 5A-5D, consider classification of different types of hysteresis loops observed with a Heusler free layer. FIG. 4 shows a bistable loop with clear hysteresis of the free layer; such bistable hysteresis loops are desirable for STT MRAM application. FIG. 5C shows multi-step switching. We have found that such multi-step switching can be reliable and reproducible, and that when device size is changed, it is possible to obtain more devices with multistep as opposed to bistable behavior. FIGS. 5A, 5B, and 5D show undesirable conditions; respectively, poor separation between the switching field of the SAF and free layer, negligible free layer coercivity or an unstable free layer; and a case where the SAF exchange field is less than free layer coercivity, $H_c$.

Figure 6A:
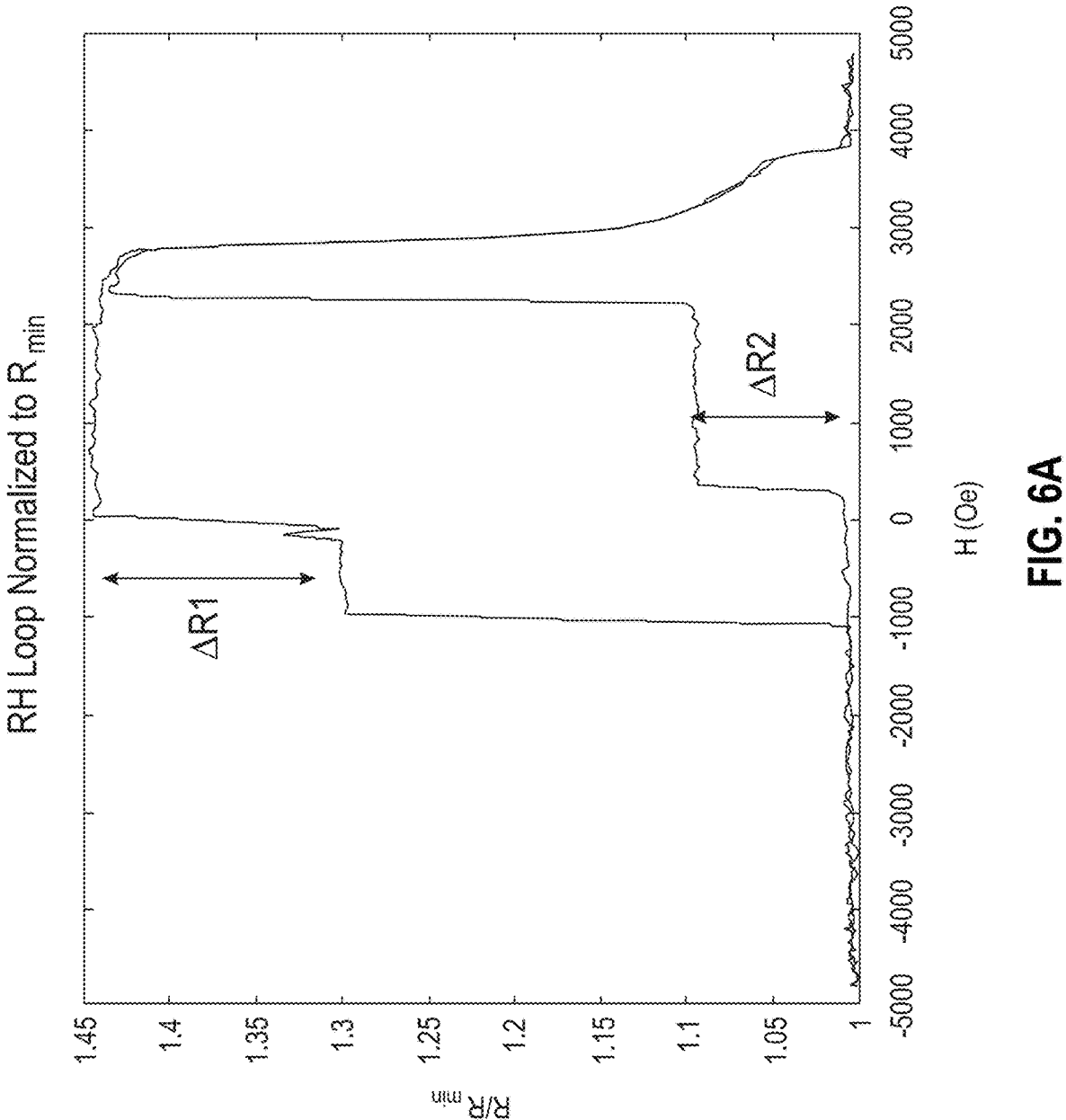
FIGS. 6A, 6B, 6C, and 6D depict an analysis of Heusler free layer MTJs with intermediate steps according to aspects of the invention.
Figure 6B:
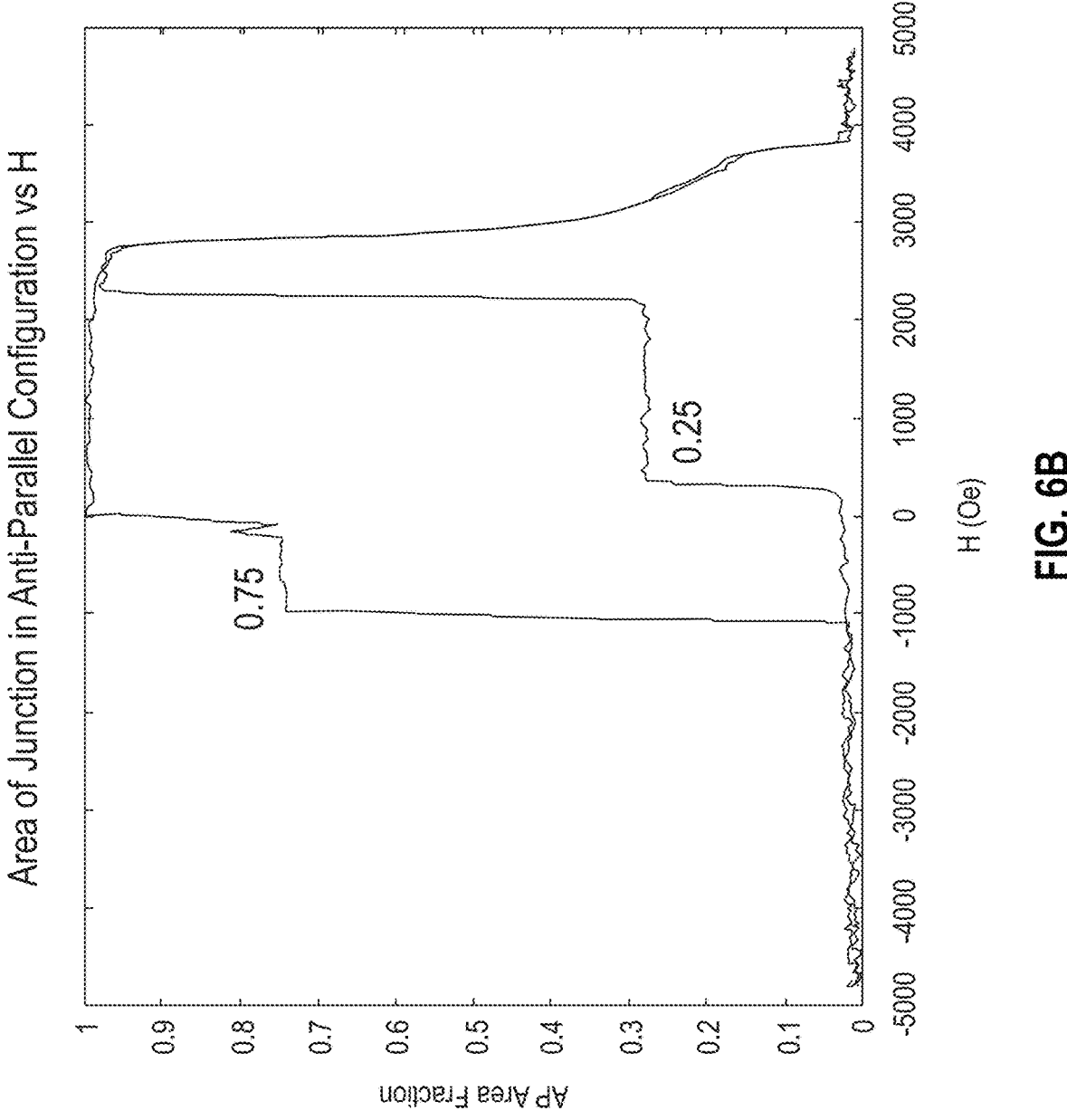
Figures 6C, 6D:
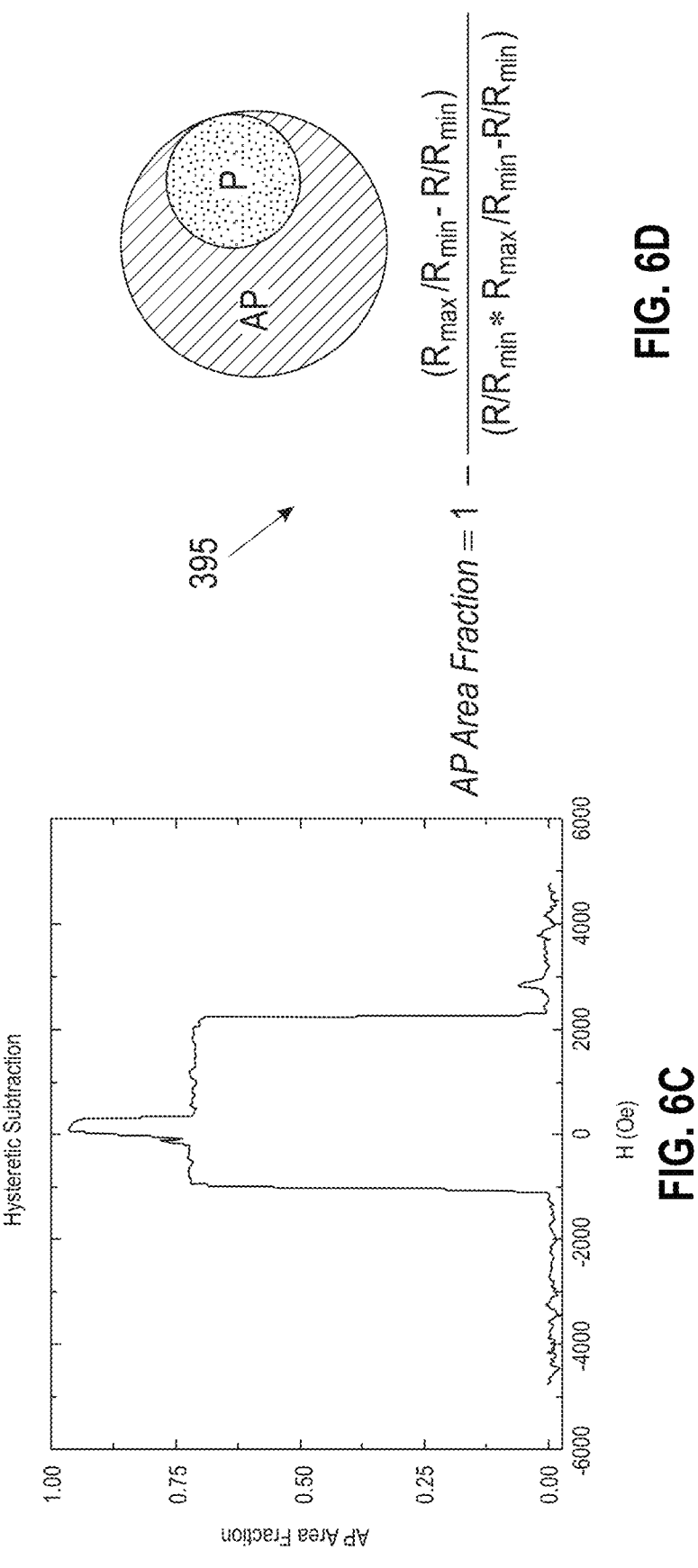

FIGS. 6A-6D depict an analysis of Heusler free layer MTJs with intermediate steps, for a sample including 50 Å Ta, 250 Å Ru, 100 Å Ta, 5 Å $(CoFe)_{80}B_{20}$, 300 Å $Mn_xN$, 850 Å CoAl, 50 Å IrAl, 150 Å CoAl, 17 Å $Mn_3Ge$ annealed at 342° C., 12.5 Å MgO, 6 Å $(CoFe)_{70}B_{30}$—26 Å $(CoFe)_{80}B_{20}$, 3.0 Å MgO, 4 Å Ta (IBE clean)(IBE=ion beam etch), SAF, 100 Å Ru. Note that, as used herein, CoFe represents an alloy of Co and Fe without referring to a specific stoichiometry. FIG. 6A shows normalized resistance $R/R_{min}$ (where $R_{min}$ is the minimum value of R) versus applied magnetic field H in Oersteds (Oe). The RH loop refers to changing the field. The values ΔR1 and ΔR2 show the changes in resistance from, respectively, the maximum and minimum values of resistance. FIG. 6B shows the fraction of the junction area that is in the anti-parallel (high resistance) configuration versus magnetic field H in Oersteds (Oe). The values 0.75 and 0.25 respectively show fraction of the device that have switched to/remain in the anti-parallel state. We have found that the intermediate states are reproducible, not random/ stochastic. FIG. 6C shows the anti-parallel fraction on the start of the loop less the anti-parallel fraction on the return versus magnetic field H in Oersteds (Oe). The anti-parallel (AP) area fraction is calculated with equation 395 in FIG. 6D where the anti-parallel (AP) region is designated in downward-rightward slanting section lines and the parallel region (P) is designated with dots. The intermediate states during AP to P switching and P to AP switching correspond to each other.

Figures 7A, 7B:
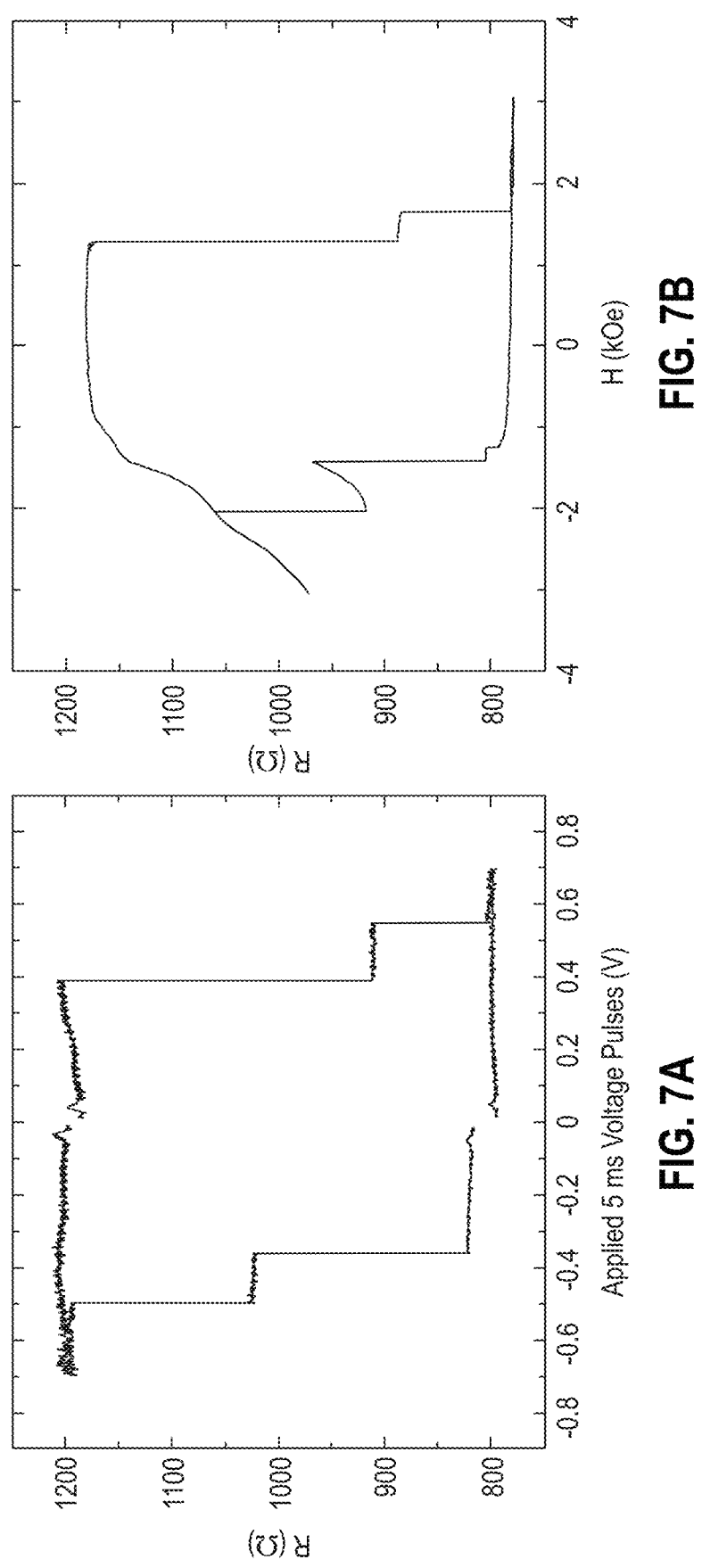
FIGS. 7A and 7B show that intermediate states are accessible in resistance-voltage (R-V) and resistance-applied magnetic field (R-H) measurements according to aspects of the invention.

FIGS. 7A and 7B show that intermediate states are accessible in resistance-voltage (R-V) measurements according to aspects of the invention, for a sample including 50 Å Ta, 5 Å $(CoFe)_{80}B_{20}$, 50 Å $Sc_xN$, 400 Å Cr, 50 Å IrAl, 150 Å CoAl, 17 Å $Mn_3Ge$ annealed at 342° C., 15.6 Å MgO, 7 Å $(CoFe)_{70}B_{30}$, 8 Å $(CoFe)_{80}B_{20}$, 2.4 Å Ta, SAF, 100 Å Ru. In a non-limiting example, the sample is cooled prior to depositing 15.6 Å MgO and subsequent layers. The cooling parameters can be determined heuristically by the skilled artisan depending on the particulars of the sample. In a non-limiting example, the sample temperature can be cooled as low as ~100K. The same intermediate states are observed both for field-driven (FIG. 7B) and spin-transfer-torque switching (FIG. 7A).

Figures 8A, 8B:
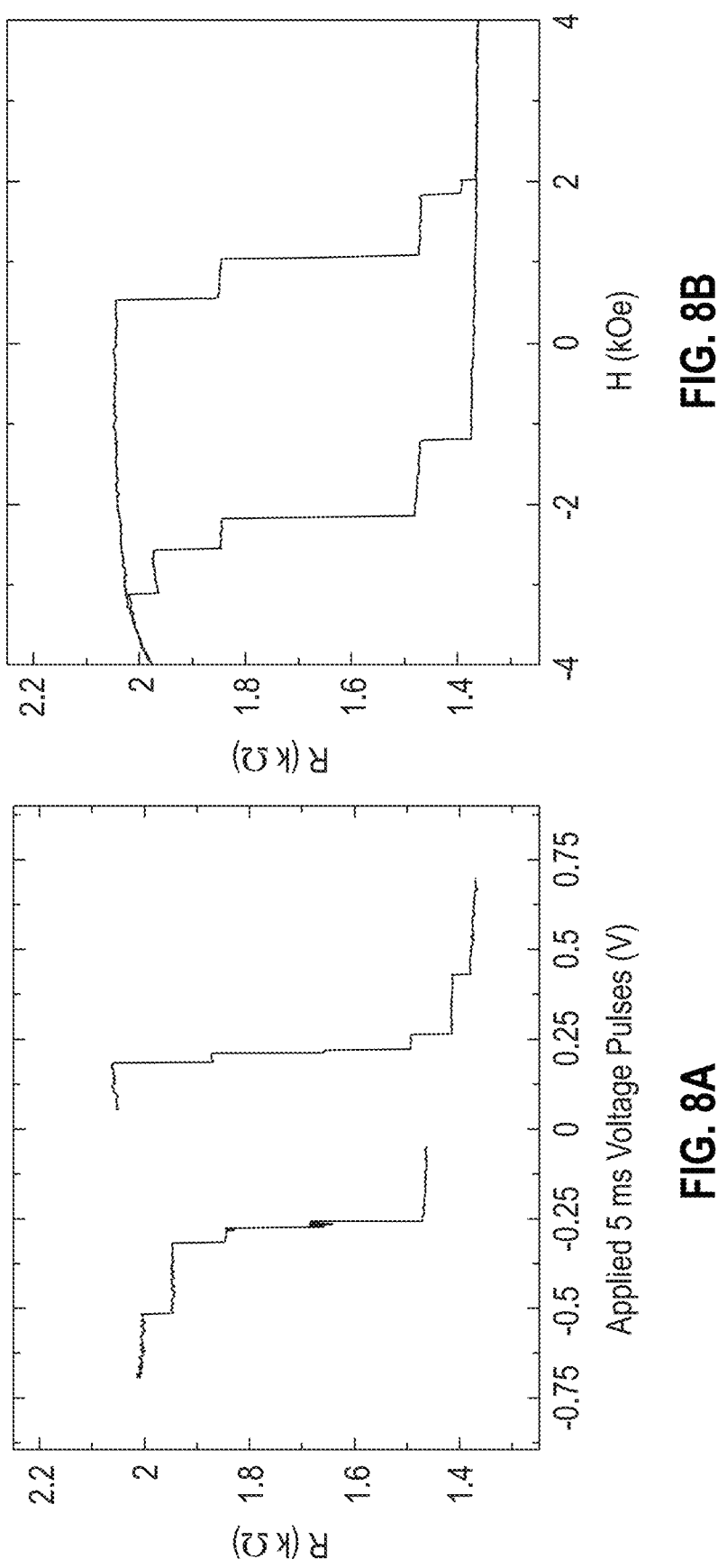
FIGS. 8A and 8B show characteristics of an MTJ device with more than three states according to aspects of the invention.

FIGS. 8A and 8B show characteristics of an MTJ device with more than three states, for a sample including 50 Å Ta, 5 Å $(CoFe)_{80}B_{20}$, 50 Å $Sc_xN$, 400 Å Cr, 50 Å WAl, 150 Å CoAl, 15 Å $Mn_3Ge$ annealed at 342° C., 16 Å MgO, 7 Å $(CoFe)_{70}B_{30}$, 7 Å $(CoFe)_{80}B_{20}$, 2.9 Å Ta, SAF, 100 Å Ru. The R-V curve of FIG. 8A refers to electrical switching while the R-H curve of FIG. 8B refers to field switching.

Figure 9A:
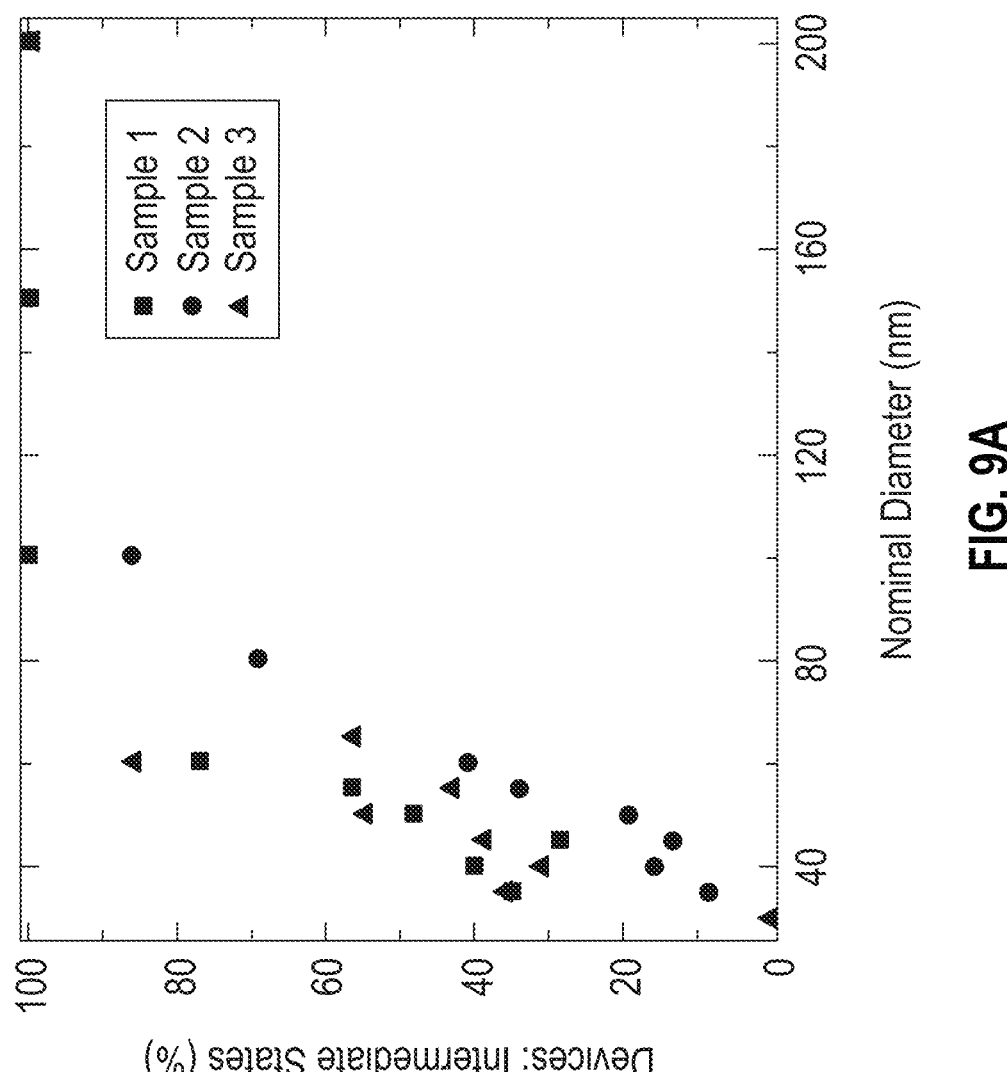
FIGS. 9A, 9B, and 9C show dependence of intermediate states on device size according to aspects of the invention.
Figures 9B, 9C:
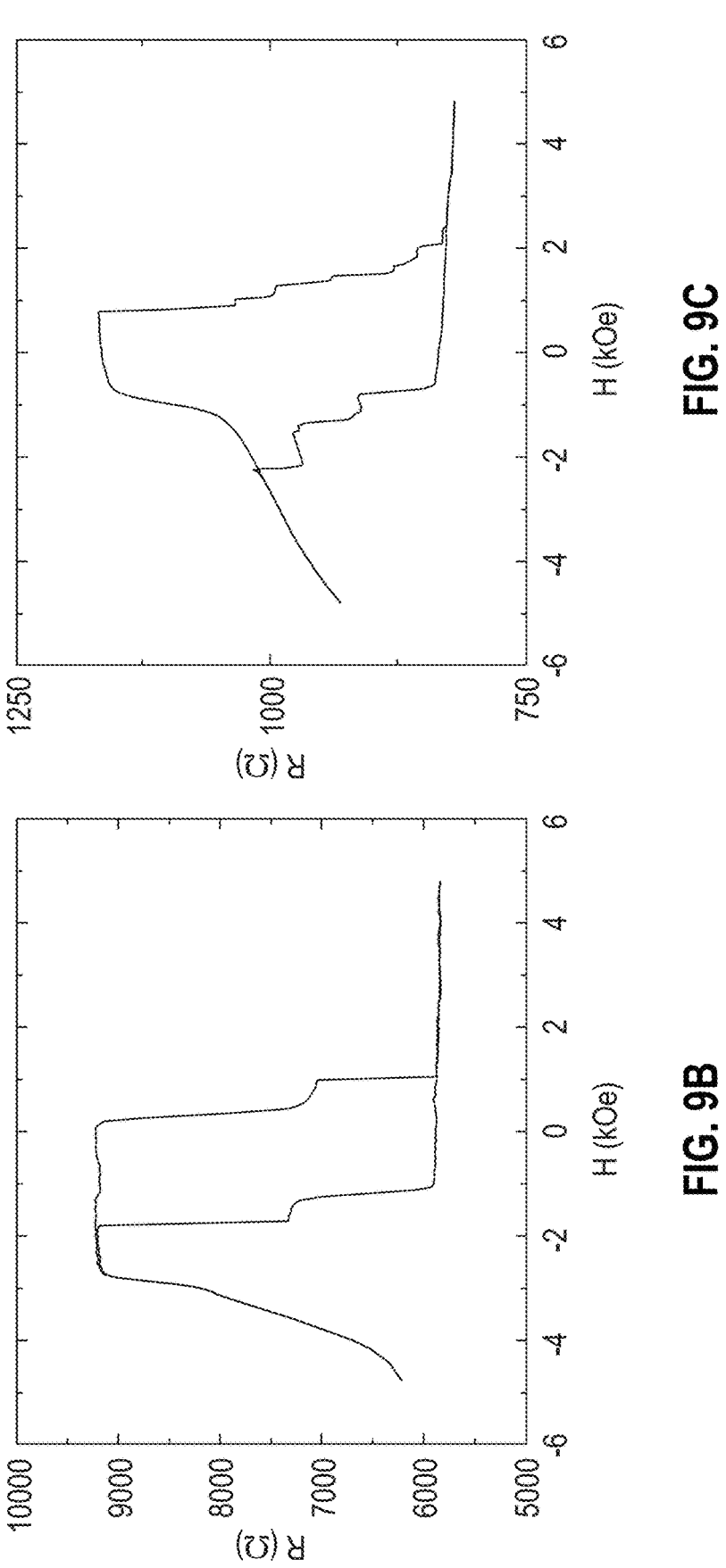

Refer now to FIGS. 9A-9C, which depict dependence of intermediate states on device size for three different samples:

Sample 1 (square data points): 50 Å Ta, 250 Å Ru, 100 Å Ta, 5 Å $(CoFe)_{80}B_{20}$, 200 Å $Mn_xN$, 4 Å MgO, 150 Å CoAl, 50 Å IrAl, 150 Å CoAl, 20.5 Å $Mn_3Ge$ annealed at 342° C., 12.5 Å MgO, 6 Å $(CoFe)_{70}B_{30}$—6.5 Å $(CoFe)_{80}B_{20}$, 2.9 Å Ta, SAF, 100 Å Ru.

Sample 2 (circle data points): 50 Å Ta, 250 Å Ru, 100 Å Ta, 5 Å $(CoFe)_{80}B_{20}$, 300 Å $Mn_xN$, 850 Å CoAl, 50 Å IrAl, 150 Å CoAl, 17 Å $Mn_3Ge$ annealed at 342° C., 12.5 Å MgO, 6 Å $(CoFe)_{70}B_{30}$—26 Å $(CoFe)_{80}B_{20}$, 3.0 Å MgO, 4 Å Ta (IBE clean), SAF, 100 Å Ru.

Sample 3 (triangle data points): 50 Å Ta, 250 Å Ru, 100 Å Ta, 5 Å $(CoFe)_{80}B_{20}$, 300 Å $Mn_xN$, 650 Å CoAl, 50 Å IrAl, 150 Å CoAl, 19 Å $Mn_3Ge$ annealed at 342° C., 11.5 Å MgO, 6 Å $(CoFe)_{70}B_{30}$—7.5 Å $(CoFe)_{80}B_{20}$, 2.8 Å Ta, SAF, 100 Å Ru.

Referring to FIG. 9A, which plots the percentage of devices with intermediate states versus nominal device diameter in nm, relatively small device diameters are shown in the lower left-hand corner of the graph and relatively larger ones in the upper right-hand corner. As the diameter of the device increases, the number of devices with intermediate states increases. Once a device size of about 100 nm is reached, essentially every device has an intermediate state. For larger device sizes, not only is the probability of having an intermediate state higher, but the number of intermediate states is also higher.

FIG. 9B shows for Sample 1 an R-H curve for a device with nominal diameter of 45 nm, while FIG. 9C shows an R-H curve for a device with nominal diameter of 100 nm.

Figure 10:
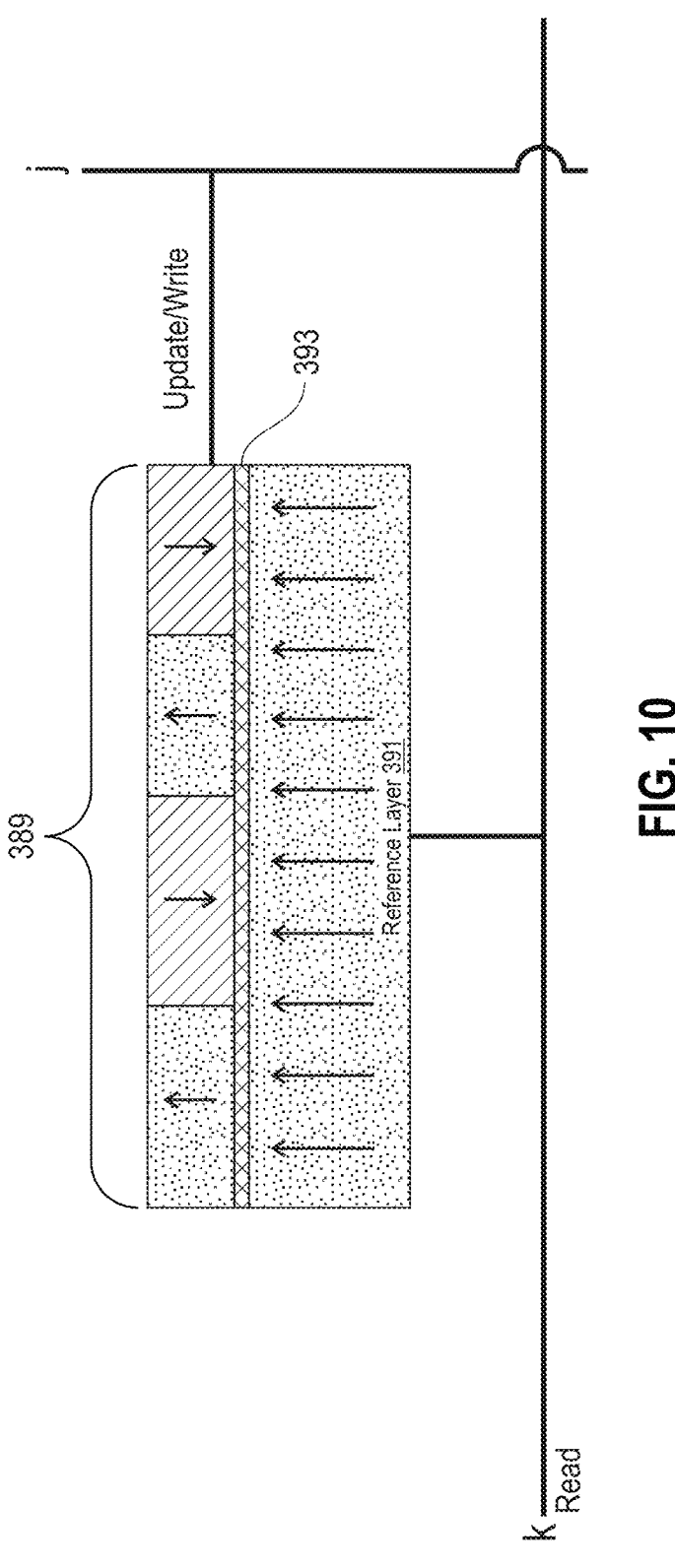
FIG. 10 shows a two-terminal magnetic tunnel device which can be used in multi-bit flash memory according to aspects of the invention.

Refer now to FIGS. 10 and 14. FIG. 10 shows a two-terminal magnetic tunnel device that can be used in the multibit flash memory array of FIG. 14, discussed further below. Note the tunnel barrier 393, reference layer/pinned layer 391, and storage layer/free layer 389. In storage layer 389, the differently shaded regions show that part of the device is switched and part is not.

Figure 11:
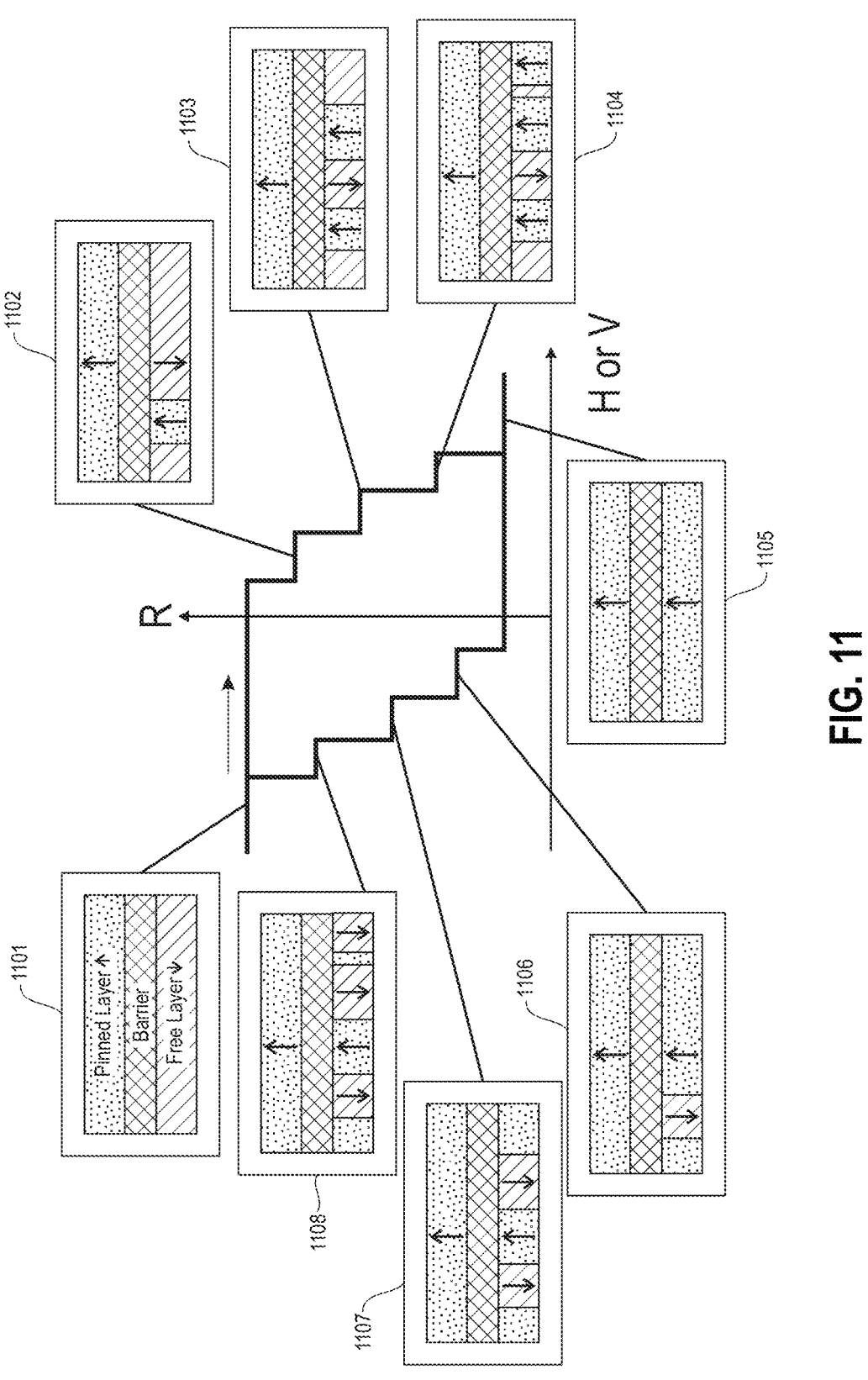
FIG. 11 shows an analog MTJ device mechanism which can be used in multi-bit flash memory according to aspects of the invention.

FIG. 11 shows how a device looks for multiple intermediate states (analog MTJ device mechanism for multiple bit flash). Note that purely as a matter of illustrative choice, FIG. 10 shows the reference layer 391 at the bottom while in FIG. 11 the reference layers are depicted at the top. We have found that intermediate states can be formed and it is believed that they may be formed by domain nucleation and propagation and/or multi-domain nucleation in the free layer—the intermediate states enable the multi-bit aspect. The example device in FIG. 11 has eight different states 1101, 1102, 1103, 1104, 1105, 1106, 1107, and 1108. The pinned layer remains in a constant state. The entire free layer is in an anti-parallel (AP) state in state 1101. As in FIG. 6D, the anti-parallel (AP) region is designated with downward-rightward slanting section lines and the parallel region (P) is designated with dots. In state 1102, most of the free layer is still in an AP state with a small P region. In state 1103, the free layer now has two small P regions, and in state 1104, three P regions. In state 1105, the entire free layer is now in the P state. In state 1106, most of the free layer is still in a P state with a small AP region. In state 1107, the free layer now has two small AP regions, and in state 1108, three AP regions.

Figure 12:
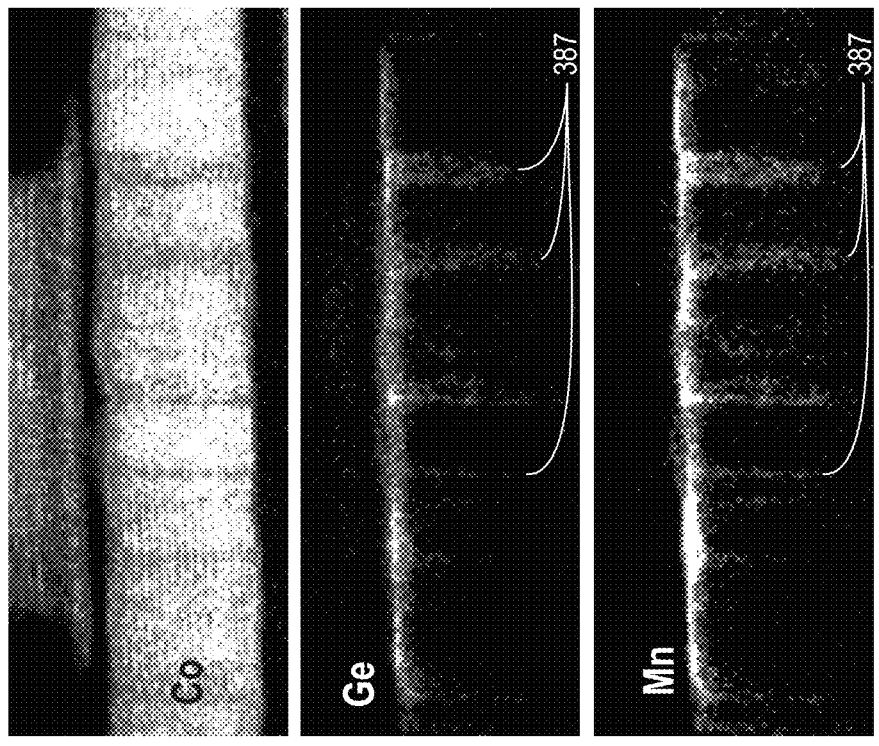
FIG. 12 shows a Transmission Electron Microscope (TEM) electron energy loss spectroscopy (EELS) analysis of an $Mn_3Ge$ device on Si substrates according to aspects of the invention.

FIG. 12 illustrates aspects of why the intermediate states are obtained, using a TEM-EELS analysis. The right-hand side of FIG. 12 is an elemental heat map. The lines 387 show how the Mn (bottom) and Ge (middle) are diffusing. Thus, it will be appreciated that some interdiffusion is noted from the $Mn_3Ge$ layer. The interdiffusion causes a domain-type of behavior because after the interdiffusion the $Mn_3Ge$ layer is no longer uniform. There are ways to make the $Mn_3Ge$ non-uniform. The top "Co" figure on the right of FIG. 12 shows the cobalt aluminum (CoAl) templating layer underneath the device. The left-hand portion of FIG. 12 is a TEM image of the device (top) on the templating layer.

One or more embodiments provide 2-terminal devices that are smaller than prior-art three-terminal racetrack type devices, but are larger than devices used for MRAM applications (which are about 35 nm). We have found that multiple states in field-driven and STT-MTJ devices can result from pinning sites in different grains or diffusion of Heusler alloy components (i.e., Mn and Ge) into the underlying chemical templating layer along grain boundaries. This diffusion leads to non-uniformities in the Heusler free layer, resulting in multiple states. Non-uniformity in Heusler films gives rise to multiple regions within the Heusler free layer, displaying non-uniform magnetic properties such as coercivities and current-induced switching of magnetization. The diffusion of the Heusler material's component atoms can be tuned or amplified by several methods: use of high temperature anneal; appropriate choice of seed layers, e.g. Ta/Ru/Ta instead of Ta; by external techniques such as ion bombardment; and the like. We have found that the number of intermediate states for an MTJ device increases with its size. As discussed, in testing we found that every device showed multiple states for device sizes of 100 nm or above for the material stacks studied. The multiple states can be accessed either by external field or current that flows through the MTJ with Heusler films as the free layer. The multiple state devices can be used for artificial neural network applications due to their analog device features.

We have found that there are a number of advantages in using Heusler-based MTJ devices for multi-bit flash applications. Advantageously, the switching between these multiple states is reproducible. No specialized device fabrication processing is necessary to access multi-state devices. We have found that the MTJ device size can be close to 100 nm, making it easier to fabricate than typically smaller 35 nm MRAM devices. Moreover, these 100 nm MTJ devices are significantly smaller than the typical racetrack MTJ devices. Hence, a higher area density should be achievable, as compared to prior-art lateral racetrack devices. Further, the endurance of the Heusler-based MTJs where there is switching of magnetic state of the storage layer is better than that of prior-art devices.

It is worth noting that a device RA (product of resistance and area) of ~10 $\Omega\mu m^2$ is a design point for MRAM MTJ devices where stability of dielectric breakdown has been established. Advantageously, the device RA of one or more embodiments is not limited to ~10 $\Omega\mu m^2$, which improves stability towards dielectric breakdown by permitting a thicker MgO barrier layer (increasing barrier thickness enhances stability and lowers the chance of dielectric breakdown). An exemplary MTJ device has advantages over resistive devices and phase change devices, as the MTJ devices have symmetric operation and threshold behavior. Since the intermediate states from the MTJs based on Heusler alloys are determined by internal nanostructures such as grains, significantly smaller devices can exhibit the corresponding analog functionalities. We have found that by tuning the size and shape and the seed layer thickness (e.g., dusting layer thickness between 1 Å to 10 Å), this multiple step characteristic can be easily tuned.

A layer is referred to as "interfacial" or "sub-monolayer" or "dusting" herein when it is not a complete layer, i.e., it is not even a monolayer. A thin layer, less than a monolayer, can be discontinuous (i.e., a monolayer with holes) or sparse (material forming the layer reacts with or undergoes adsorption onto the layer underneath). Thus, the terminology "interfacial or dusting layer." Note, as used herein, including the claims, a "sub-monolayer layer" (e.g., sub-monolayer nitride layer) is intended to define a layer having a sub-monolayer thickness on average, and to include both discontinuous such layers (i.e., having local monolayer thickness and holes) and layers with reaction/adsorption.

Referring again to FIG. 14, an array of MTJ devices 1202 is shown. Each cell 1202 (e.g., embodiment of FIG. 13) is connected to a respective transistor 1204 that controls reading and writing. A word line 1206 provides data to write to the cells 1202, while a bit line 1210 and a bit line complement 1208 read data from the cell 1202. In this manner, a large array of memory devices can be implemented on a single chip. An arbitrarily large number of cells 1202 can be employed, within the limits of the manufacturing processes and design specifications.

Writing data to a cell 1202 includes applying voltage pulses to the cell (see FIGS. 7A and 8A). This causes the direction of magnetization to switch between a parallel or anti-parallel state for parts of the layer 1405, which has the effect of switching between different resistance states. Because this effect can be used to represent the 1s and 0s of digital information, the cells 1202 can be used as a non-volatile memory. The device can code more than one bit as in FIG. 7A where the upper left-hand side (LHS) codes 00, the lower right-hand side (RHS) codes 11, the LHS middle codes 01, and the RHS middle codes 10, for example. Reading the bits stored in a cell 1202 involves applying a voltage (lower than that used for writing information) to the cell 1202 to discover what resistance to current is offered and to correlate same with the corresponding 00, 11, 01, 10. It is worth noting that FIGS. 7A and 8A depict exemplary 5 ms writing pulses but it is possible to write with current pulses of different times; even on the order of ns (nanoseconds). Given the discussion herein, the skilled artisan can select appropriate pulse widths for a given application.

FIG. 13 shows an embodiment with a Heusler compound as a free layer 1405. In a non-limiting exemplary embodiment, the seed layer 1403 is located on substrate 1401 and will typically be topped with a nitride layer 1403A (which can, but need not necessarily be, interfacial—can also be thicker than interfacial). An overlying CTL 1403B is provided, with or without a Cr layer. Substrate 1401 is typically silicon with, depending on the application, CMOS circuitry such as transistors and access lines permitting selection of individual devices (as discussed with respect to FIG. 14). Other than the novel magnetic tunnel junction devices described herein, conventional transistors (where appropriate), access lines, peripheral circuits, and the like can be employed—refer to discussion of FIGS. 13 and 14. The CTL 1403B or even a multilayer of CTLs can be grown on a suitable surface such as the interfacial nitride. Heusler layer 1405 is located on the CTL, and can be formed, for example, by epitaxial growth on the CTL. Polarization enhancement layer 1407 is optionally located outward of layer 1405; layer 1407, where present, can include, for example, a thin layer of magnetic material such as cobalt. Tunnel barrier 1409 is located outward of layer 1407 (where present), else outward of layer 1405; barrier 1409 can include, for example, MgO, $MgAl_2O_4$, or the like. Magnetic layer 1411 includes conventional cobalt, iron, nickel, or alloys, or could also include Heusler or half-Heusler materials. Synthetic anti-ferromagnet (SAF) layer 1413, where present, is located outward of layer 1411. Typically a Synthetic Anti-Ferromagnet (SAF) layer includes a Co/Pt multilayer (not shown) that is magnetically coupled to the underlying magnetic layer to achieve needed performance. A thin layer (not shown) of Ta or Ir or Ru or Mo (order of few A) may typically be interposed between the magnetic layer and the SAF layer. Cap layer 1415 is located outward of layer 1413 (where present), else outward of layer 1411. The cap layer may include Mo, W, Ta, Pt, Ru, or a combination thereof. In FIG. 13, the double-headed arrow indicates that the Heusler layer 1405 is a free layer wherein the state can be changed (parallel to anti-parallel and back), while the single-headed arrow indicates that the magnetic layer 1411 is a pinned or reference layer with constant/fixed state.

Refer again to the discussion of Sample 1, Sample 2, Sample 3, and the discussion of FIGS. 6A-6D. As noted, FIGS. 6A-6D depict an analysis of Heusler free layer MTJs with intermediate steps, for an exemplary Sample 2 which includes 50 Å Ta, 250 Å Ru, 100 Å Ta, 5 Å $(CoFe)_{80}B_{20}$, 300 Å $Mn_xN$, 850 Å CoAl, 50 Å IrAl, 150 Å CoAl, 17 Å $Mn_3Ge$ annealed at 342° C., 12.5 Å MgO, 6 Å $(CoFe)_{70}B_{30}$—26 Å $(CoFe)_{80}B_{20}$, 3.0 Å MgO, 4 Å Ta (IBE clean)(IBE=ion beam etch), SAF, and 100 Å Ru.

Seed layer 1403 can include the 50 Å Ta, 250 Å Ru, 100 Å Ta, and 5 Å $(CoFe)_{80}B_{20}$.

The nitride layer 1403A includes the 300 Å $Mn_xN$.

The templating layer 1403B atop the nitride layer includes the 850 Å CoAl, 50 Å IrAl, and 150 Å CoAl.

The Heusler layer 1405 includes the 17 Å $Mn_3Ge$ annealed at 342° C.

The tunnel barrier 1409 includes the 12.5 Å MgO.

The magnetic layer 1411 includes the 6 Å $(CoFe)_{70}B_{30}$—26 Å $(CoFe)_{80}B_{20}$, 3.0 Å MgO, and 4 Å Ta (IBE clean) (IBE=ion beam etch).

The cap layer 1415 includes 100 Å Ru.

It will thus be appreciated that one or more embodiments provide a structure including a substrate 1401 and a seed layer 1403 overlying the substrate. The seed layer includes, for example, Ta or Ta/Ru/Ta. A nitride layer 1403A is formed with Mn, Sc, Ti, Cr, V, or the like overlying the seed layer 1403; in one or more embodiments, this nitride layer thickness is greater than 5 Å. A templating layer 1403B atop the nitride layer includes a binary alloy having a cesium chloride (CsCl) structure with a thickness of greater than 50 Å. A magnetic layer 1405 overlies the templating layer; the magnetic layer includes a Heusler compound whose magnetization is substantially perpendicular to the layer and is annealed at a temperature greater than 300° C.

In one or more embodiments, the Heusler compound is $Mn_3Ge$. In one or more such embodiments, the Heusler layer has a thickness of less than 5 nm.

In one or more embodiments, the binary alloy with CsCl structure is represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55.

One or more such embodiments further include a tunnel barrier 1409 in contact with the Heusler layer 1405. The tunnel barrier can be, for example, MgO.

In one or more embodiments, the Heusler compound is selected from the group consisting of $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$. In one or more such embodiments, the Heusler layer has a thickness of less than 5 nm.

In one or more embodiments, the binary alloy with CsCl structure is represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55.

One or more such embodiments further include a tunnel barrier 1409 in contact with the Heusler layer 1405. The tunnel barrier can be, for example, $MgAl_2O_4$, which can be used as a tunnel barrier whose lattice spacing can be tuned (engineered) by controlling the Mg—Al composition to result in better lattice matching with the Heusler compounds (e.g., the composition of this tunnel barrier can be represented as $Mg_{1-z}Al_{2+(2/3)z}O_4$, wherein −0.5<z<0.5).

Any of the MTJ devices fabricated from any of the structures described herein can be, for example, >50 nm in diameter, or even >60 nm in diameter, or even >80 nm in diameter, or even >90 nm in diameter, or even >100 nm in diameter (these are all non-limiting examples; see FIG. 9A indicating that the percentage of devices with intermediate states increases as the nominal diameter increases).

One or more embodiments thus provide a material stack with a Heusler compound as a free layer in a Magnetic tunnel junction (MTJ) device for multi-bit flash memory applications. The magnetic layers of the MTJs have their magnetization along a direction perpendicular to the thickness of the film. During switching of the Heusler free layer within the chosen material stack, several intermediates are observed. These states correspond to switching of a region within the free layer. These intermediate states are reproducible and controllable and can be used to implement multibit flash memory.

One or more embodiments provide a nitride seed layer that facilitates the requisite texture in the chemical templating layers. Chemical templating layers (CTL) promote the growth of ordered Heusler compounds. In one or more embodiments, the CTL should have a (001) orientation to induce perpendicular magnetic anisotropy (PMA) in the Heusler compound. The CTLs have an alternating layer structure.

As noted, the Heusler layer can be produced via growth on a suitable templating layer. By way of review, in a templating concept a templating layer is grown and another layer (e.g., Heusler compound) is grown on top of it. Templating essentially means that the layer being grown on the templating layer grows to the lattice constant a of the underlayer/seed layer. The material seeks to conserve its unit cell volume. Referring again to FIG. 2, CoAl is a layered structure. In the Heusler compound 403, the all-Mn layer, because it contains only a transition metal, prefers to grow on the Al of the templating layer, while the MnSb layer, because it also has a main group element, prefers to grow on the Co, and thus ordering is obtained in the material 403. Atomic steps 405 are inherent in the templating layer 401 but do not disturb the ordering in the Heusler material 403.

In some cases, the tunnel barrier is $MgAl_2O_4$, which can be used as a tunnel barrier whose lattice spacing can be tuned (engineered) by controlling the Mg—Al composition to result in better lattice matching with the Heusler compounds (e.g., the composition of this tunnel barrier can be represented as $Mg_{1-z}Al_{2+(2/3)z}O_4$, wherein $-0.5 < z < 0.5$).

As will be appreciated by the skilled artisan, typically, the magnetization is not fixed, but rather, the magnetization precesses like a spinning top at a non-zero temperature. This can change depending on temperature. In view of this precession, perpendicularity, as used herein, refers to perpendicularity of the time integral/average of the path of the magnetization. The time integral/average of the path of the magnetization could be, for example, "exactly" perpendicular, perpendicular within +/−5%, or perpendicular within +/−10%.

In some such cases, the templating layer or chemical templating layer which is a binary alloy is represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55. In some such cases, a tunnel barrier 1409 is located in contact with the Heusler layer; the tunnel barrier can include, for example, MgO (magnesium aluminum oxide is a suitable alternative to MgO with magnesium aluminum oxide having the form $Mg_{1-z}Al_{2+(2/3)z}O_4$, wherein $-0.5 < z < 0.5$).

It should be noted that the Heusler compounds are indicated by stoichiometric formulas, and this does not preclude small variations of up to several % from the nominal values.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, ion milling, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method, including the epitaxial growth of the Heusler material on the templating layer, and the structures formed thereby, are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* 1st Edition, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from Heusler alloy based spin-transfer-torque magnetic tunnel junctions for flash memory and the like.

An integrated circuit in accordance with aspects of the present inventions can be employed in essentially any application and/or electronic system where Heusler alloy based spin-transfer-torque magnetic tunnel junctions for flash memory and the like would be beneficial. Given the teachings of the present disclosure provided herein, one of ordinary skill in the art will be able to contemplate other implementations and applications of embodiments disclosed herein.

Reference should now be had to FIG. 16, which depicts a computing environment according to an embodiment of the present invention (e.g., for implementing a design process such as that of FIG. 17)

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a system 200 for semiconductor design and/or control of semiconductor fabrication (see FIG. 17). In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 16. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future.

Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 17 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 17 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. Generally, layers depicted in the drawings as directly touching may be directly contacting as just described, or may have intervening layers. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

The invention claimed is:

1. A memory array, comprising:
a plurality of bit lines and a plurality of complementary bit lines forming a plurality of bit line-complementary bit line pairs;
a plurality of word lines intersecting the plurality of bit line pairs at a plurality of cell locations;
a plurality of magnetic tunnel junction cells located at each of the plurality of cell locations, each of the magnetic tunnel junction cells being electrically connected to a corresponding bit line and selectively interconnected to a corresponding one of the complementary bit lines under control of a corresponding one of the word lines, each of the plurality of magnetic tunnel junction cells comprising:
a substrate;
a seed layer overlying the substrate;
a nitride layer, overlying the seed layer;
a templating layer, outward of the nitride layer, comprising a binary alloy having an alternating layer lattice structure, and having a thickness greater than 50 Angstroms;
a magnetic layer overlying the templating layer, the magnetic layer comprising a Heusler compound and exhibiting perpendicular magnetic anisotropy (PMA);
a tunnel barrier outward of the magnetic layer; and
a magnetic layer outward of the tunnel barrier;
peripheral circuitry coupled to the plurality of bit line-complementary bit line pairs and the plurality of word lines;
a power supply; and
a controller coupled to the power supply and the peripheral circuitry,
wherein the peripheral circuitry, the power supply, and the controller are cooperatively configured to:
apply signals to the word lines to cause a first subset of the cells to store first logical values, a second subset of the cells to store second logical values, and a third subset of the cells to store third logical values, wherein the first, second, and third logical values are all different; and
read the first, second, and third stored logical values via the bit lines and the complementary bit lines.

2. The memory array of claim 1, wherein a cell diameter of each cell is greater than 50 nm.

3. The memory array of claim 1, wherein:
the layer that includes the Heusler compound comprises a free layer; and
the magnetic layer comprises a pinned layer.

4. The memory array of claim 3, wherein the Heusler compound is selected from the group consisting of $Mn_3Ge$, $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$.

5. The memory array of claim 4, wherein the Heusler compound comprises $Mn_3Ge$.

6. The memory array of claim 4, wherein the layer that includes the Heusler compound has a thickness of less than 5 nm.

7. The memory array of claim 6, wherein the tunnel barrier is selected from the group consisting of magnesium oxide and magnesium aluminum oxide.

8. The memory array of claim 7, wherein the tunnel barrier comprises magnesium oxide.

9. The memory array of claim 7, wherein the tunnel barrier comprises $Mg_{1-z}Al_{2+(2/3)z}O_4$, wherein $-0.5<z<0.5$.

10. The memory array of claim 7, wherein the binary alloy is represented by $A_{1-x}E_x$, wherein A is a transition metal element and E is a main group element including at least one of aluminum and gallium, and x is in the range from 0.42 to 0.55.

11. The memory array of claim 7, wherein the binary alloy comprises CoAl.

12. The memory array of claim 1, wherein the alternating layer lattice structure of the templating layer comprises a cesium chloride structure.

13. A method of operating a memory array, comprising:
providing a memory array, the array comprising:
a plurality of bit lines and a plurality of complementary bit lines forming a plurality of bit line-complementary bit line pairs;
a plurality of word lines intersecting the plurality of bit line pairs at a plurality of cell locations; and
a plurality of magnetic tunnel junction cells located at each of the plurality of cell locations, each of the magnetic tunnel junction cells being electrically connected to a corresponding bit line and selectively interconnected to a corresponding one of the complementary bit lines under control of a corresponding one of the word lines, each of the plurality of magnetic tunnel junction cells comprising:
a substrate;
a seed layer overlying the substrate;
a nitride layer, overlying the seed layer;
a templating layer, outward of the nitride layer, comprising a binary alloy having an alternating layer lattice structure, and having a thickness greater than 50 Angstroms;
a magnetic layer overlying the templating layer, the magnetic layer comprising a Heusler compound and exhibiting perpendicular magnetic anisotropy (PMA);
a tunnel barrier outward of the magnetic layer; and
a magnetic layer outward of the tunnel barrier;
providing peripheral circuitry coupled to the plurality of bit line-complementary bit line pairs and the plurality of word lines, a power supply, and a controller coupled to the power supply and the peripheral circuitry;
applying signals, by way of the peripheral circuitry, the power supply, and the controller, cooperatively, to the word lines to cause a first subset of the cells to store first logical values, a second subset of the cells to store second logical values, and a third subset of the cells to store third logical values, the first, second, and third logical values being different; and reading the first, second, and third stored logical values via the bit lines and the complementary bit lines.

14. A hardware description language (HDL) design structure encoded on a machine-readable data storage medium, the HDL design structure comprising elements that when processed in a computer-aided design system generates a machine-executable representation of a memory array, wherein the (HDL design structure) comprises:

a plurality of bit lines and a plurality of complementary bit lines forming a plurality of bit line-complementary bit line pairs;

a plurality of word lines intersecting the plurality of bit line pairs at a plurality of cell locations;

a plurality of magnetic tunnel junction cells located at each of the plurality of cell locations, each of the magnetic tunnel junction cells being electrically connected to a corresponding bit line and selectively interconnected to a corresponding one of the complementary bit lines under control of a corresponding one of the word lines, each of the plurality of magnetic tunnel junction cells comprising:

a substrate;

a seed layer overlying the substrate;

a nitride layer, overlying the seed layer;

a templating layer, outward of the nitride layer, comprising a binary alloy having an alternating layer lattice structure, and having a thickness greater than 50 Angstroms;

a magnetic layer overlying the templating layer, the magnetic layer comprising a Heusler compound and exhibiting perpendicular magnetic anisotropy (PMA);

a tunnel barrier outward of the magnetic layer; and a magnetic layer outward of the tunnel barrier;

peripheral circuitry coupled to the plurality of bit line-complementary bit line pairs and the plurality of word lines;

a power supply; and a controller coupled to the power supply and the peripheral circuitry, wherein the peripheral circuitry, the power supply, and the controller are cooperatively configured to:

apply signals to the word lines to cause a first subset of the cells to store first logical values, a second subset of the cells to store second logical values, and a third subset of the cells to store third logical values, wherein the first, second, and third logical values are all different; and read the first, second, and third stored logical values via the bit lines and the complementary bit lines.

15. The hardware description language (HDL) design structure of claim 14, wherein a cell diameter of each cell is greater than 50 nm.

16. The hardware description language (HDL) design structure of claim 15, wherein:

the layer that includes the Heusler compound comprises a free layer; and the magnetic layer comprises a pinned layer.

17. The hardware description language (HDL) design structure of claim 16, wherein the Heusler compound is selected from the group consisting of $Mn_3Ge$, $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$.

18. The hardware description language (HDL) design structure of claim 17, wherein the Heusler compound comprises $Mn_3Ge$.

19. The hardware description language (HDL) design structure of claim 17, wherein the layer that includes the Heusler compound has a thickness of less than 5 nm.

20. The hardware description language (HDL) design structure of claim 19, wherein the tunnel barrier is selected from the group consisting of magnesium oxide and magnesium aluminum oxide.

21. The hardware description language (HDL) design structure of claim 20, wherein the tunnel barrier comprises magnesium oxide.

22. The hardware description language (HDL) design structure of claim 20, wherein the tunnel barrier comprises $Mg_{1-z}Al_{2+(2/3)z}O_4$, wherein $-0.5<z<0.5$.

23. The hardware description language (HDL) design structure of claim 20, wherein the binary alloy is represented by $A_{1-x}E_x$, wherein A is a transition metal element and E is a main group element including at least one of aluminum and gallium, and x is in the range from 0.42 to 0.55.

24. The memory array of claim 1, wherein each of the plurality of magnetic tunnel junction cells include intermediate states used in storing multiple bits.

* * * * *